United States Patent
Hyun et al.

(10) Patent No.: US 11,933,851 B2
(45) Date of Patent: Mar. 19, 2024

(54) DEVICE AND METHOD FOR CONTROLLING CHARGING ON BASIS OF BATTERY CHARGING OR DISCHARGING TIME

(71) Applicant: Samsung Electronics Co., Ltd., Gyeonggi-do (KR)

(72) Inventors: Yonghwan Hyun, Gyeonggi-do (KR); Sengtai Lee, Gyeonggi-do (KR); Jinhyuk Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 713 days.

(21) Appl. No.: 16/968,906

(22) PCT Filed: Feb. 21, 2019

(86) PCT No.: PCT/KR2019/002107
§ 371 (c)(1),
(2) Date: Aug. 11, 2020

(87) PCT Pub. No.: WO2019/164285
PCT Pub. Date: Aug. 29, 2019

(65) Prior Publication Data
US 2021/0048479 A1   Feb. 18, 2021

(30) Foreign Application Priority Data
Feb. 23, 2018   (KR) .................. 10-2018-0021741

(51) Int. Cl.
*G01R 31/36* (2020.01)
*G01R 31/387* (2019.01)
(Continued)

(52) U.S. Cl.
CPC ..... *G01R 31/3648* (2013.01); *G01R 31/3646* (2019.01); *G01R 31/387* (2019.01); *H01M 10/44* (2013.01); *H02J 7/00714* (2020.01)

(58) Field of Classification Search
CPC .......................... G01R 31/387; G01R 31/3648
(Continued)

(56) References Cited

U.S. PATENT DOCUMENTS

| | | | |
|---|---|---|---|
| 2005/0134230 A1* | 6/2005 | Sato | H02J 7/0036 320/136 |
| 2012/0049787 A1 | 3/2012 | Kuroiwa | |

(Continued)

FOREIGN PATENT DOCUMENTS

| | | |
|---|---|---|
| JP | 2007-24687 A | 2/2007 |
| JP | 5507100 B2 | 5/2014 |

(Continued)

OTHER PUBLICATIONS

Korean Office Action dated Oct. 25, 2022.

*Primary Examiner* — Ricky Go
(74) *Attorney, Agent, or Firm* — Cha & Reiter, LLC

(57) ABSTRACT

According to various embodiments of the present invention, an electronic device may comprise a battery, a power management module, and a processor. The processor may be configured to: acquire power for battery charging from a source outside the electronic device through the power management module, charge the battery at a designated current value by using the power, check charging state information based on charging time and battery capacity according to charging in a designated charging state measurement interval after the charging is started, and when the charging state information satisfies a given condition, perform a designated operation associated with the battery. Various other embodiments are also possible.

15 Claims, 18 Drawing Sheets

(51) Int. Cl.
 *H01M 10/44* (2006.01)
 *H02J 7/00* (2006.01)
(58) Field of Classification Search
 USPC .......................................................... 702/63
 See application file for complete search history.

(56) References Cited

U.S. PATENT DOCUMENTS

| | | | |
|---|---|---|---|
| 2012/0293122 A1* | 11/2012 | Murawaka | B60L 53/64 |
| | | | 320/109 |
| 2013/0082662 A1* | 4/2013 | Carre | H02J 7/00 |
| | | | 320/134 |
| 2013/0300378 A1 | 11/2013 | Sugiyama | |
| 2015/0241519 A1 | 8/2015 | Lee et al. | |
| 2018/0257492 A1* | 9/2018 | O'Hara | H01M 10/0525 |

FOREIGN PATENT DOCUMENTS

| | | |
|---|---|---|
| KR | 10-1280366 B1 | 7/2013 |
| KR | 10-1473156 B1 | 12/2014 |
| KR | 10-2015-0077249 A | 7/2015 |
| KR | 10-2015-0099284 A | 8/2015 |
| KR | 10-1821326 B1 | 1/2018 |

\* cited by examiner

DEVICE AND METHOD FOR CONTROLLING CHARGING ON BASIS OF BATTERY CHARGING OR DISCHARGING TIME

CROSS REFERENCE TO RELATED APPLICATIONS

This application is a National Phase Entry of PCT International Application No. PCT/KR2019/002107, which was filed on Feb. 21, 2019, and claims a priority to Korean Patent Application No. 10-2018-0021741, which was filed on Feb. 23, 2018, the contents of which are incorporated herein by reference.

TECHNICAL FIELD

The disclosure relates to an apparatus and a method for identifying whether there is an error in charging and/or discharging of a battery of an electronic device.

BACKGROUND ART

An electronic device may perform functions related to battery power. The electronic device may be connected to a charging device to perform a battery charging operation and perform a predetermined function by charged battery power. The battery that performs a charging/discharging operation may swell or explode. Battery swelling may occur due to a defect of the battery, or overcharging and overdischarging of the battery. For example, when moisture remains in a battery cell, a short circuit may be generated during battery charging or discharging and thus the cell may swell. The battery may include a PCM circuit therein in order to prevent the internal cell from overcharging and overdischarging. When the Protection Circuit Module (PCM) has a defect, the battery may swell by a charging or discharging operation.

The electronic device may perform various functions while using battery power as operation power. When a function such as a game is performed, battery power may be rapidly consumed. The electronic device may periodically perform the charging/discharging operation on the basis of battery power consumption. The frequent charging/discharging operation may make the battery superannuated, and the use of the superannuated battery limits the performance of functions of the electronic device.

DISCLOSURE OF INVENTION

Technical Problem

Accordingly, in order to prevent in advance swelling or explosion of a battery due to defects of a battery cell, overcharging, and overdischarging, it may be needed to measure a battery state, inform a user of a battery malfunction state (for example, malfunction of a battery cell, malfunction of a PCM circuit, short-circuit, and aging) and stop the operation being performed (for example, charging and/or discharging) when the battery state satisfies a predetermined condition.

An electronic device according to various embodiments may provide an apparatus and a method for measuring charging state information based on a charging time in a predetermined charging state measurement interval after charging of the battery starts and a battery capacity according to the charging and, when the measured charging state information satisfies a predetermined condition, stopping a battery charging operation and displaying a malfunction state.

An electronic device according to various embodiments may provide an apparatus and a method for measuring discharging state information based on a discharging time in a predetermined discharging state measurement interval and a battery capacity according to the discharging while a predetermine function is performed and, when the measured discharging state information satisfies a predetermined condition, displaying a battery malfunction state.

Solution to Problem

In accordance with an aspect of the disclosure, an electronic device may include a battery, a power management module, and a processor. The processor may be configured to acquire power for charging the battery from outside of the electronic device through the power management module, charge the battery with a predetermined current value using the power, identify charging state information based on a charging time and a battery capacity according to the charging in a predetermined charging state measurement interval after the charging starts, and perform a predetermined operation related to the battery when the charging state information satisfies a predetermined condition.

In accordance with another aspect of the disclosure, an electronic device may include a battery, a power management module, and a processor. The processor may be configured to perform a predetermined function using the battery, identify discharging state information, based on a discharging time in a predetermined discharging state measurement interval and a battery capacity according to the discharging while the predetermined function is performed, and perform a predetermined operation related to the battery when the discharging state information satisfies a predetermined condition.

In accordance with another aspect of the disclosure, a method of controlling an operation of a battery by an electronic device may include: acquiring power for charging the battery from outside of the electronic device; charging the battery with a predetermined current value using the power; identifying charging state information based on a charging time in a predetermined charging state measurement interval and a capacity of the battery according to the charging after the charging starts; and when the charging state information satisfies a predetermined condition, performing a predetermined operation related to the battery.

Advantageous Effects of Invention

An electronic device according to various embodiments may measure a battery state in a configured measurement interval in which a charging and/or discharging operation is performed and determine whether the battery malfunctions or not. The electronic device may recognize a battery malfunction state when performing the charging/discharging operation, and prevent a Product Liability (PL) accident by identifying swelling of the battery before appearance of the battery changes. The electronic device may identify and display whether the battery malfunctions while performing the charging/discharging operation of the battery, and a user may induce battery exchange and/or visit a service center according to the displayed information on the battery malfunction state.

BEST MODE FOR CARRYING OUT THE INVENTION

Hereinafter, various embodiments of the disclosure will be described with reference to the accompanying drawings.

Figure 1:
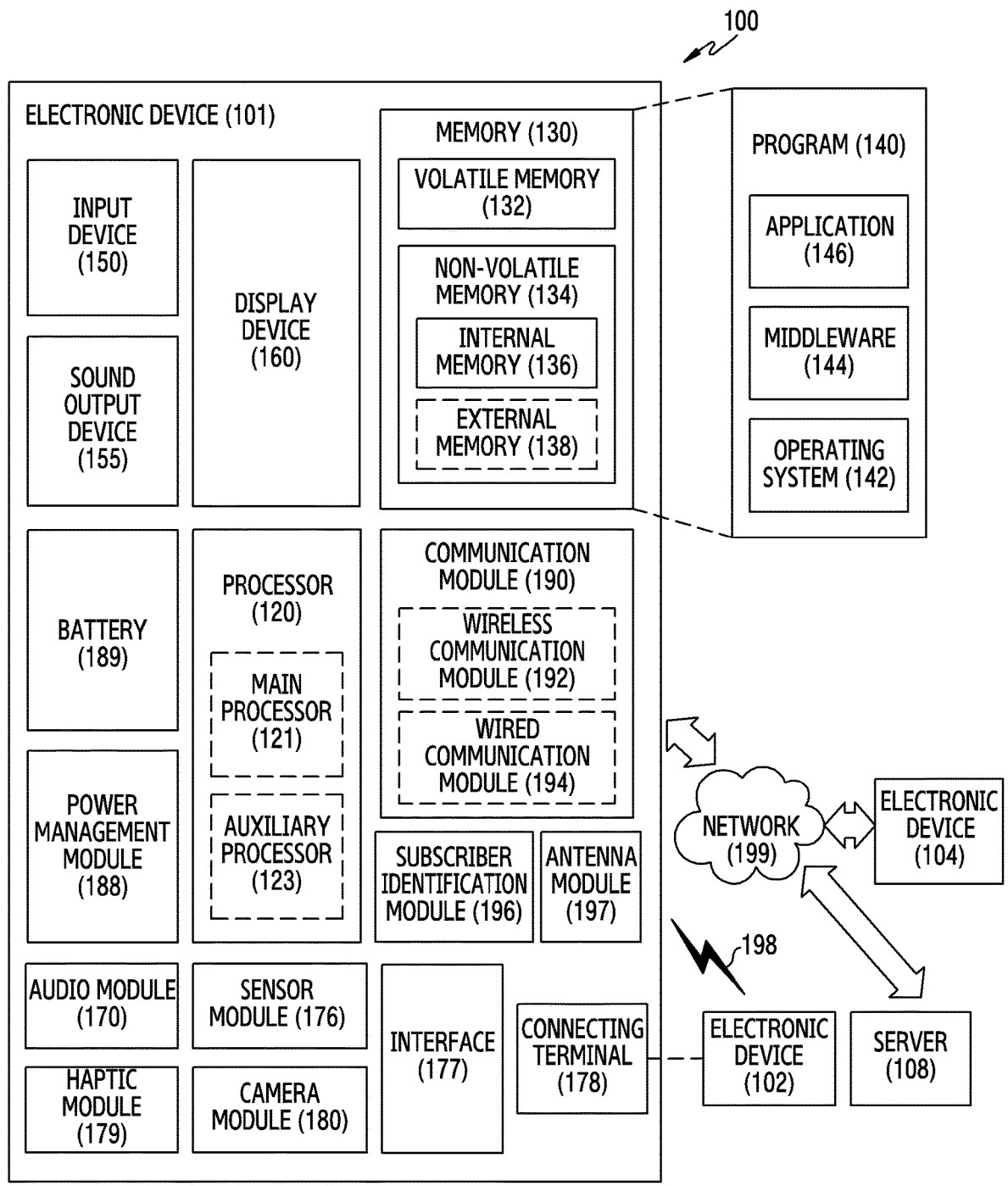
FIG. 1 is a block diagram of an electronic device 101 within a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally, or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry".

A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
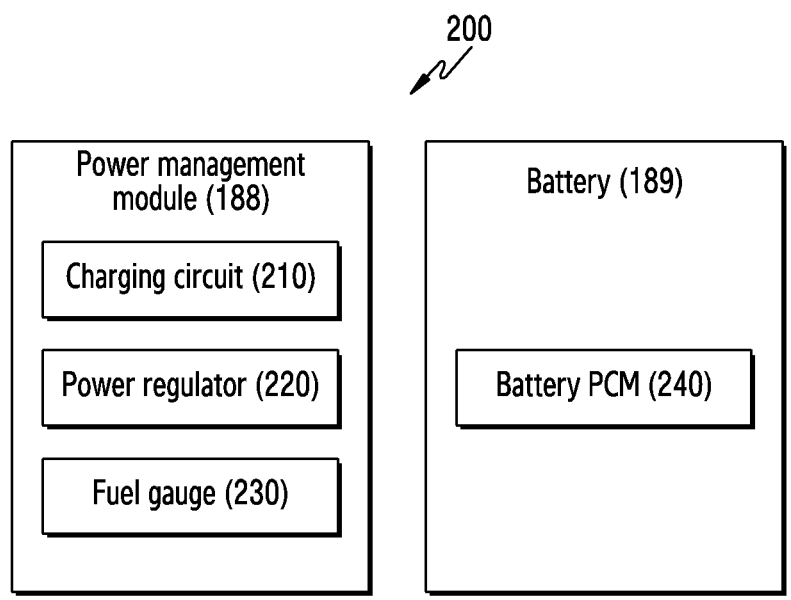
FIG. 2 is a block diagram of a power management module and a battery according to various embodiments.

FIG. 2 is a block diagram 200 of a power management module 188 and a battery 189 according to various embodiments.

Referring to FIG. 2, the power management module 188 may include a charging circuit 210, a power regulator 220, or a power gauge 230. The charging circuit 210 may charge the battery 189 with power supplied from an external power source of the electronic device 101. According to an embodiment, the charging circuit 210 may select a charging scheme (for example, normal charging or quick charging) on the basis of at least some of the type of the external power source (for example, a power adaptor, a USB, or wireless charging), the size of power that can be supplied from the external power source (for example, higher than or equal to 20 Watts), or attributes of the battery 189 and charge the battery 189 through the selected charging scheme. The external power source may be wiredly connected through, for example, the connection terminal 178 or wirelessly connected through the antenna module 197.

The power regulator 220 may generate a plurality of powers having different voltage or current levels by controlling a voltage level or a current level supplied from, for example, the external power source or the battery 189. The power regulator 220 may control power of the external power source or the battery 189 to be a voltage or current level suitable for each of the elements included in the electronic device 101. According to an embodiment, the power regulator 220 may be implemented in the form of a Low Drop Out (LDO) regulator or a switching regulator. The power gauge 230 may measure usage state information of the battery (for example, capacity of the battery 189, the number of charges/discharges, voltage, or temperature).

The power management module 188 may determine charging state information (for example, lifespan, overvoltage, undervoltage, overcurrent, overcharging, overdischarging, overheat, short circuit, or swelling) related to charging of the battery 189 on the basis of at least some of the measured usage state information through, for example, the charging circuit 210, the voltage regulator 220, or the power gauge 230. The power management module 188 may determine whether the battery 189 is normal or malfunctions on the basis of at least some of the determined charging state information. When it is determined that the battery malfunctions, the power management module 188 may control charging of the battery 189 (for example, reduce a charging current or voltage or stop charging). According to an embodiment, at least some of the functions of the power management module 188 may be performed by an external control device (for example, the processor 120).

The battery 189 may include a battery Protection Circuit Module (PCM) 240 according to an embodiment. The battery PCM 240 may perform one or more of various functions (for example, a pre-blocking function) to prevent performance deterioration or damage of the battery 189. The battery PCM 240 may be additionally or alternatively configured as at least part of a Battery Management System (BMS) for performing cell balancing, battery capability measurement, measurement of the number of charges/discharges, temperature measurement, or voltage measurement.

According to an embodiment, at least some of the usage state information or the charging state information of the battery 189 may be measured using a corresponding sensor (for example, a temperature sensor) in the sensor module 176, the power gauge 230, or the power management module 188. According to an embodiment, the corresponding sensor (for example, the temperature sensor) of the sensor module 176 may be included as the part of the battery PCM 140 or located near the battery 189 as a separate device.

Figure 3:
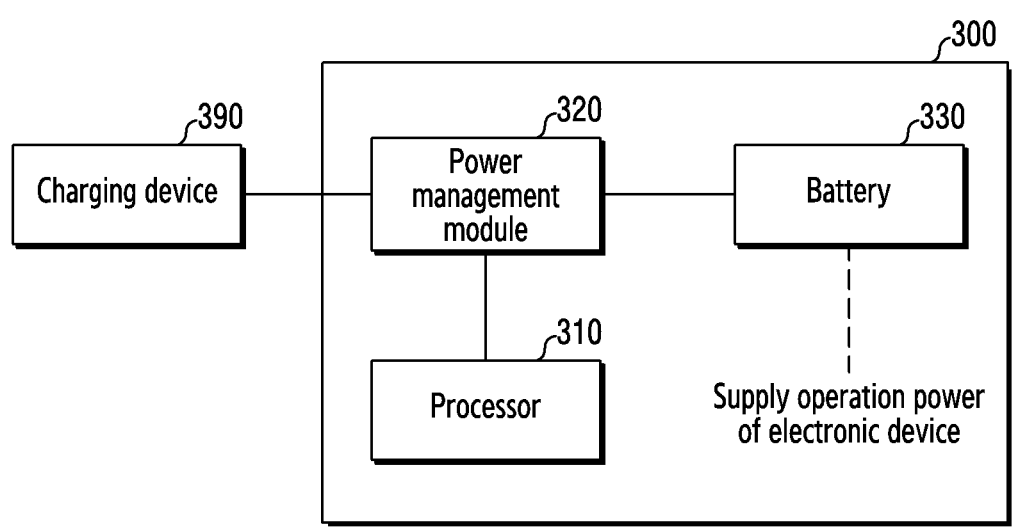
FIG. 3 illustrates a configuration of the electronic device according to various embodiments.

FIG. 3 illustrates the configuration of the electronic device according to various embodiments.

Referring to FIG. 3, an electronic device 300 (for example, the electronic device 100, 102, or 104 of FIG. 1) may be wiredly or wirelessly connected to a charging device 390 to receive charging power. The electronic device 300 may include a power management module 320, a battery 330, and a processor 310.

The charging device 390 may supply power for charging a battery 330 (for example, the battery 189 of FIGS. 1 and 2). When charging the battery 330 of the electronic device 300, the user may connect the charging device 390 to the electronic device 300. The charging device 390 may be wiredly or wirelessly connected to the electronic device 300.

The power management module 320 (for example, the power management module 188 of FIGS. 1 and 2) may convert power supplied from the charging device 390 into a predetermined charging current of the battery 330 and supply the same to the battery 330. The power management module 320 may manage the charging operation of the battery 330 in a Constant Current (CC) scheme and/or a Constant Voltage (CV) scheme based on the charging state of the battery 330. The power management module 320 may measure a charging state of the battery 330 when the battery 330 is charged or discharged.

The battery 330 (for example, the battery 189 of FIGS. 1 and 2) may be changed with charging power supplied from the power management module 320 while the charging operation, and the electronic device 300 may supply operation power to a corresponding element when a predetermined operation (for example, a function or an application) is performed.

A processor 310 (for example, the processor 120 of FIG. 1) may identify the charging and/or discharging state of the battery 330 by controlling the power management module 320. A memory (for example, the memory 130 of FIG. 1) that is not illustrated may include a reference time value and/or reference capacity values of the battery to control charging and/or discharging of the battery 330. The reference time value and/or the reference capacity value stored in the memory may be configured by a manufacturer of the electronic device 300. For example, a charging capacity of the battery 330 in a CC interval may be proportional to a time and may be linearly transformed. Charging time and reference values of charging capacities corresponding to the charging time may be stored in the memory 130. For example, the capacity of the battery 330 consumed in the state in which the electronic device performs a predetermined function (for example, the state in which only applications configured in a battery measurement mode are executed) may be linearly reduced. The memory 130 may store a discharging time of the battery in the state in which a predetermined function is performed and reference values of battery capacities corresponding to the discharging time.

The processor 310 may use the CC charging scheme through the power management module 320 when charging the battery 330 and use the CV charging scheme when the charging capacity of the battery 330 becomes a predetermined size. For example, when the capacity of the battery 330 has a value between about 10% and about 80%, the processor 310 may control the charging operation through the CC charging scheme. The processor 310 may measure the charging state of the battery 330 in the CC charging interval. The processor 310 may perform various types of functions (discharging of the battery 330) in the state in which the electronic device 300 is not connected to the charging device 390. The discharging capacity of the battery 330 according to the performance of the function may be linearly reduced when only a predetermined function is performed. The processor 310 may perform a battery measurement operation on the basis of user selection (immediately or according to a predetermined time). In battery measurement, the processor 310 may perform only predetermined functions to linearly reduce power of the battery 330.

When a request for measuring the battery 330 is made, the processor 310 may acquire state information of the battery 330 by measuring the charging time and/or the capacity of the battery 330 in the charging or discharging state of the battery 330. The state information of the battery 330 may be a time value or a battery capacity value. The processor 310 may compare the acquired state information of the battery 330 with a corresponding reference value (a reference time value or capacity value) stored in the memory. When the comparison result satisfies a predetermined condition, the processor 310 may display a malfunction state of the battery 330 and control the charging or discharging operation of the battery 330.

When the connection between the electronic device 300 and the charging device 390 is recognized, the processor 310 may control the charging operation by controlling the power management module 320. The power supply module 320 may convert power supplied from the outside (the charging device 280) of the electronic device 300 into a predetermined charging current of the battery 330 and supply the same to the battery 330. When the charging operation of the battery 330 is performed, the processor 310 may perform an operation of measuring charging state information in a charging state measurement interval. For example, the processor 310 may measure charging state information based on the charging time in a predetermined charging state measurement interval after charging of the battery 330 starts and the battery capacity according to the charging and, when the charging state information satisfies a predetermined condition, perform a predetermined operation related to the battery. The predetermined operation may be an operation of displaying a malfunction state of the battery and stopping charging the battery.

According to an embodiment, the charging state measurement interval may be configured on the basis of the charging time. The processor 310 may identify a first capacity BC1 of the battery 330 in a first predetermined time T1 of the predetermined charging state measurement interval and identify a second capacity BC2 of the battery 330 in a third predetermined time T3 delayed by a second predetermined time T2 from the first predetermined time T1. When a difference (BC2−BC1) between the first capacity BC1 and the second capacity BC2 of the battery satisfies a predetermined condition, the processor 310 may perform a predetermined operation related to the battery 330. The predetermined condition may be a condition for determining the state of the battery 330 as a malfunction state. The predetermined operation may be an operation of displaying the state of the battery through a display device (for example, a display or a notification device) to allow the user to recognize the malfunction state of the battery 330. The predetermined operation may be an operation of stopping charging the battery by controlling the power management module 320.

According to an embodiment, the processor 310 may identify a first charging time TC1 in which the battery is charged with the first predetermined battery capacity BC1 and identify a second charging time TC2 in which the battery is charged with the second predetermined battery capacity BC2 through the power management module 320 in the charging state measurement interval. When a difference (TC2−TC1) between the first charging time TC1 and the second charging time TC2 satisfies a predetermined condition, the processor 310 may perform a predetermined operation related to the battery 330. The predetermined operation may be an operation of displaying the malfunction state of the battery 330 on the notification device and/or the display. The predetermined operation may be an operation of stopping charging the battery by controlling the power management module 320.

The electronic device 300 may perform a predetermined function using the battery 330 in the state in which the electronic device is not connected to the charging device 390. The processor 310 may measure discharging state information based on the discharging time in the predetermined discharging state measurement interval and the battery capacity according to the discharging while the predetermined function is performed. When the measured discharging state information satisfies a predetermined condition, the processor 310 may perform a predetermined operation related to the battery 330. The discharging state measurement interval may be a part of the interval in which power consumption of the battery 330 is linearly reduced in the state in which the electronic device 300 performs a predetermined function.

According to an embodiment, the processor 310 may identify a first capacity bd1 of the battery 330 through the power management module 320 in a first predetermined time t1 of the discharging state measurement interval. The processor 310 may identify a second capacity bd2 of the battery 330 through the power management module 320 in a third predetermined time t3 after a second predetermined time t2 from the first predetermined time t1. When a difference (bd1−bd2) between the first capacity bd1 and the second capacity bd2 of the battery 330 satisfies a predetermined condition, the processor 310 may perform a predetermined operation related to the battery 330. The predetermined operation may be an operation of displaying the malfunction state of the battery 330 on the notification device and/or the display. The predetermined operation may be an operation of stopping performing the function of the electronic device 300.

According to an embodiment, the processor 310 may identify a first discharging time td1 of the predetermined discharging state measurement interval in which the battery is discharged to the first predetermined battery capacity bd1 through the power management module 320. The processor 310 may identify a second discharging time td2 in which the battery is discharged to the second predetermined battery capacity bd2 through the power management module 320. When a difference (td2−td1) between the first discharging time td1 and the second discharging time td2 satisfies a predetermined condition, the processor 310 may perform a predetermined operation related to the battery 330. The predetermined operation may be an operation of displaying the malfunction state of the battery 330 through the display device. The predetermined operation may be an operation of stopping performing the function of the electronic device 300.

The electronic device according to various embodiments may include a battery, a power management module, and a processor. The processor may be configured to acquire power for charging the battery from the outside of the electronic device, charge the battery with a predetermined current value using the power, identify charging state information based on a charging time in a predetermined charging state measurement interval after the charging starts and a capacity of the battery according to the charging, and when the charging state information satisfies a predetermined condition, perform a predetermined operation related to the battery.

The processor may identify a first capacity of the battery for a first predetermined time in the predetermined charging state measurement interval, identify a second capacity of the battery for a third predetermined time after a second predetermined time from the first predetermined time, and when a difference between the first capacity and the second capacity of the battery satisfies a predetermined condition, perform a predetermined operation related to the battery.

The processor may identify a first charging time for which the battery is charged with the first predetermined battery capacity in the predetermined charging state measurement interval, identify a second charging time for which the battery is charged with the second predetermined battery capacity, and when a difference between the first charging time and the second charging time satisfies a predetermined condition, perform the predetermined operation related to the battery.

When the predetermined condition is satisfied, the processor may perform an operation of stopping a charging operation and displaying a charging malfunction state.

When a charging measurement function is activated in the charging state measurement interval, the processor may perform an operation of measuring charging state information.

The electronic device according to various embodiments may include a battery, a power management module, and a processor. The processor may be configured to perform a predetermined function using the battery, identify discharging state information, based on a discharging time in a predetermined discharging state measurement interval and a battery capacity according to the discharging while the predetermined function is performed, and perform a predetermined operation related to the battery when the discharging state information satisfies a predetermined condition.

The processor may be configured to identify a first capacity of the battery for a first predetermined time in the predetermined discharging state measurement interval and a second capacity of the battery for a third predetermined time after a second predetermined time from the first predetermined time, and perform the predetermined operation related to the battery when a difference between the first capacity and the second capacity of the battery satisfies a predetermined condition.

The processor may be configured to identify a first charging time for charging the battery with the first predetermined battery capacity and a second charging time for charging the battery with the second predetermined battery capacity in the predetermined charging state measurement interval, and perform the predetermined operation related to the battery when a difference between the first charging time and the second charging time satisfies a predetermined condition.

The processor may be configured to perform an operation of displaying a battery malfunction state when the predetermined condition is satisfied.

The process may be configured to perform an operation of identifying the charging state information when a charging measurement function is activated in the charging state measurement interval.

Figure 4A:
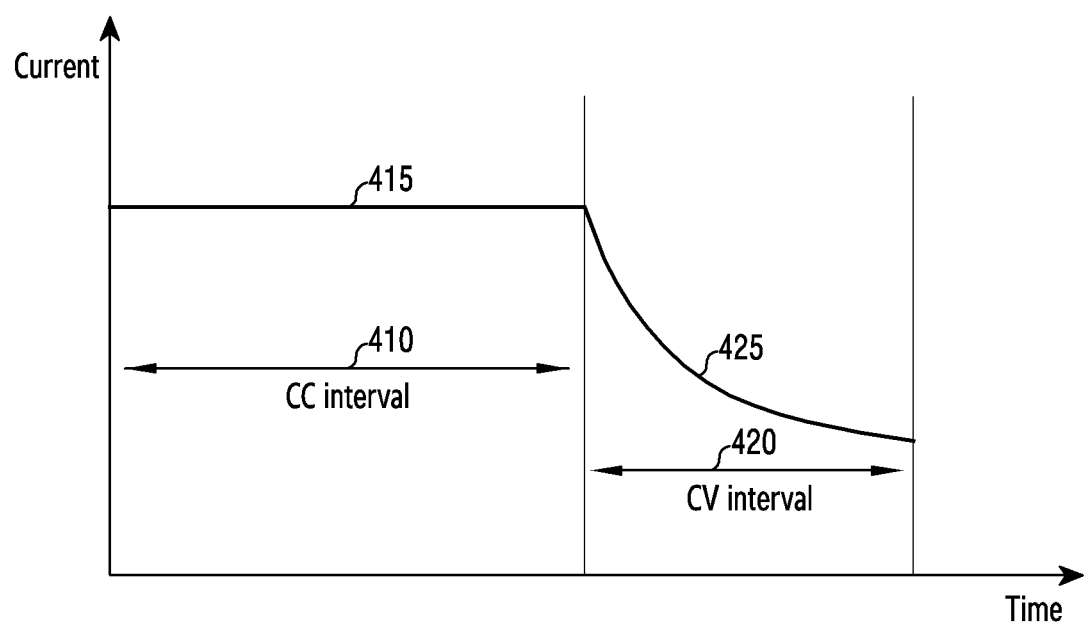
FIGS. 4A and 4B illustrate a battery charging characteristic of the electronic device according to various embodiments.
Figure 4B:
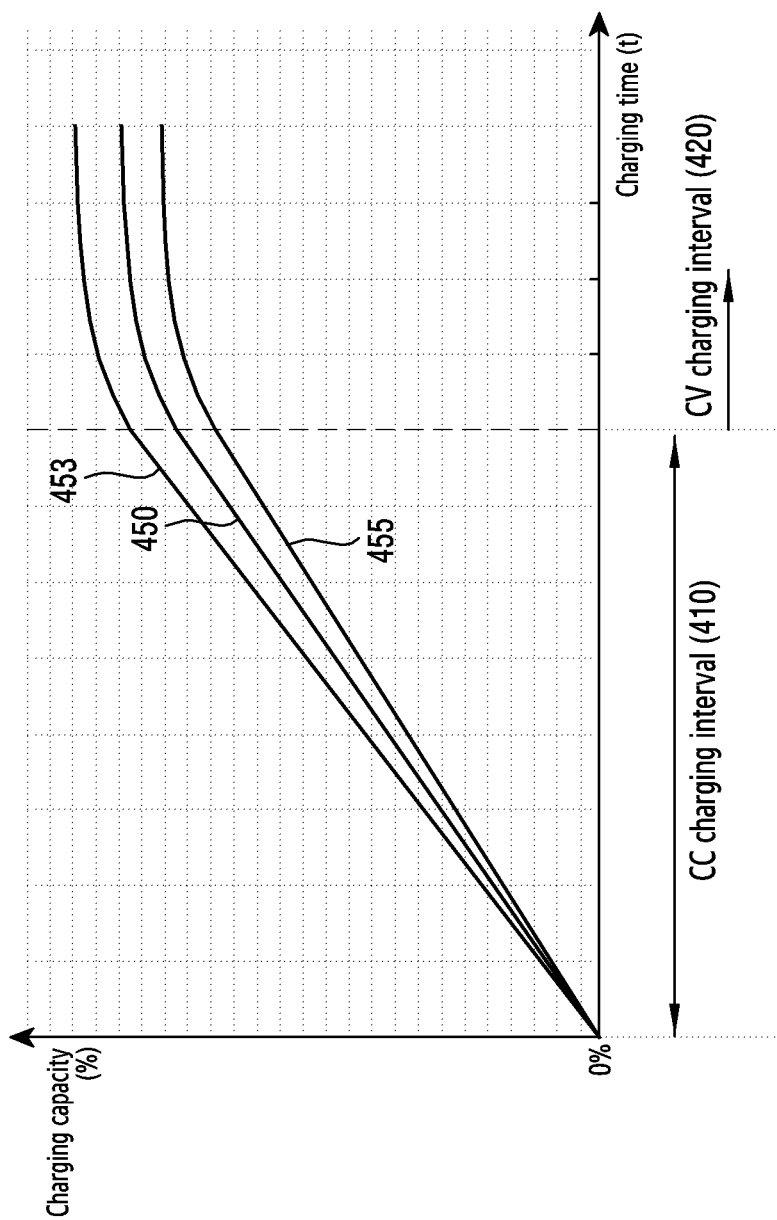

FIGS. 4A and 4B illustrates a battery charging characteristic of an electronic device according to various embodiments.

Referring to FIG. 4A, a processor (for example, the processor 120 of FIG. 1 or the processor 310 of FIG. 3) of an electronic device (for example, the electronic device 100 of FIG. 1 or the electronic device 300 of FIG. 3) may control a charging operation of a battery (for example, the battery 189 of FIG. 1 or the battery 330 of FIG. 2) in a CC interval 410 in which charging power is supplied with a Constant Current (CC) as indicated by reference numeral 415 and a CV interval 420 in which power is supplied with a Constant Voltage (CV) as indicated by reference numeral 425. The processor may perform a charging operation by applying a predetermined current to the battery in the CC interval 410 as indicated by reference numeral 415 before a voltage of the battery reaches a predetermined voltage. When the charging voltage of the battery reaches a voltage having a predetermined size, the processor may perform control to charge the battery with a constant voltage by varying a charging current in the CV interval 420 as indicated by reference numeral 425.

Referring to FIG. 4B, when the processor of the electronic device applies a predetermined current in the CC charging interval 410 and controls the charging operation of the battery, the charging capacity of the battery may linearly increase in the CC interval s illustrated in FIG. 4B.

The battery in the normal state may be charged at a slope in the CC charging interval 410 as indicated by reference numeral 450. However, the battery in the malfunction state (aging or short circuit) may have a charging slope that is larger than or smaller than the normal charging slope 450 in the CC charging interval 410 as indicated by reference numeral 453 or 455.

According to various embodiments, the state of the battery may be identified by configuring one or more measurement intervals for measuring the charging state in the CC charging interval 410 in which a charging curve linearly increases and identifying the charging time and/or charging capacities in the configured charging state measurement interval.

The electronic device may measure the charging time and/or the charging capacity in a specific State of Charge (SOC) change interval of the CC charging interval 410 at a time point of manufacture and store the measured charging time value and/or the charging capacity values in a memory (for example, a specific register). For example, the CC charging interval 410 may be an interval in which the SOC is at a level from about 10% to about 80%. In the CC charging interval 410, the charging current of the battery may be constantly supplied, and the charging time according to a change in the SOC may be the same in every CC interval. For example, in a charging interval in which the change in the SOC is from about 15% to about 20% or from about 45% to about 50%, a charging time may be the same.

The electronic device may measure the charging time and/or the charging capacity of the battery in the predetermined charging state measurement interval of the CC charging interval 410 and identify the state of the battery by comparing the charging time and/or the charging capacity measured in the measured interval with the charging and/or charging capacities recorded in the specific register. For example, the charging time and/or the charging capacity stored in the specific register may be the charging time value and/or the charging capacity value of the battery in the normal state. The electronic device may compare the charging time and/or the charging capacity measured in the charging state measurement interval with values stored in the specific register. When the electronic device has a value different from the normal state charging slope 450 as indicated by reference numeral 453 or 455 of FIG. 4B (for example, larger than or equal to the charging time and the charging capacity value of the specific register as indicated by reference numeral 453 and 455), the electronic device may determine that the battery is in the malfunction state.

Figure 5:
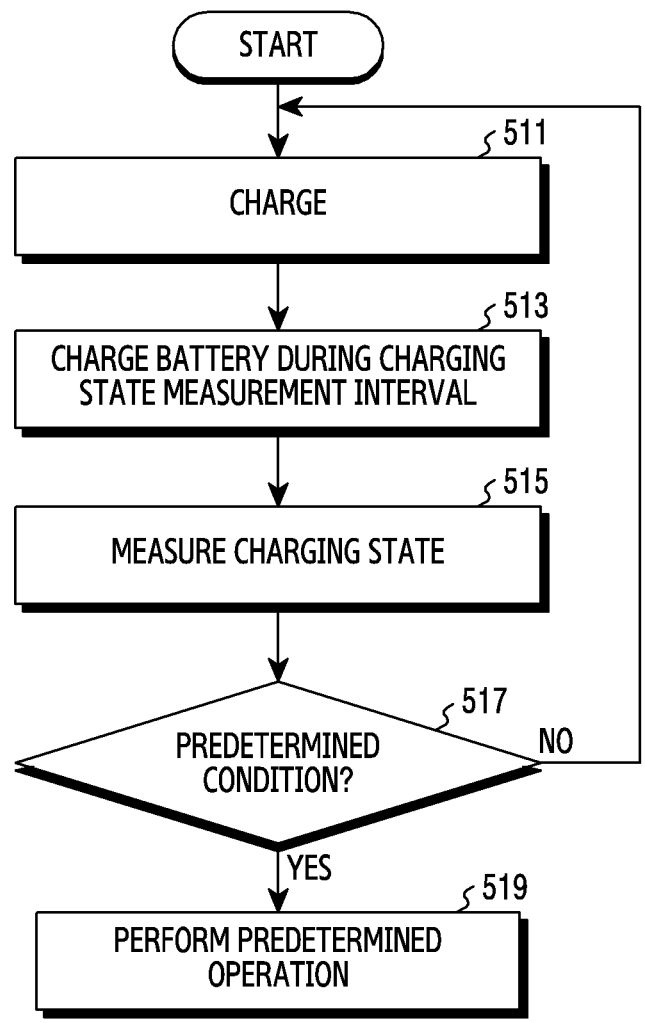
FIG. 5 is a flowchart illustrating an operation in which the electronic device determines a battery state on the basis of a battery charging state according to various embodiments.

FIG. 5 is a flowchart illustrating an operation in which the electronic device identifies a battery state on the basis of a battery charging state according to various embodiments.

Referring to FIG. 5, when an external charging device (for example, the charging device 390 of FIG. 3) is wiredly or wirelessly connected, a processor (for example, the processor 120 of FIG. 1 or the processor 310 of FIG. 3) of an electronic device (for example, the electronic device 100 of FIG. 1 or the electronic device 300 of FIG. 3) may control an operation of recognizing the connection and charging a battery (for example, the battery 189 of FIGS. 1 and 2 or the battery 330 of FIG. 3) in step 611. A power management module (for example, the power management module 188 of FIG. 1 or the power management module 320 of FIG. 3) may convert power supplied to a charging device connected to the electronic device into charging power of the battery and apply the power to the battery, and the processor may acquire charging state information of the battery through the power management module. The power management module may supply CC charging power until the battery reaches a predetermined voltage under the control of the processor and supply CV charging power when the battery reaches the predetermined voltage. As illustrated in FIG. 4B, the charging voltage of the battery in the CC charging interval 410 may linearly increase. The processor may configure at least a part of the CC charging interval 410 as a charging measurement interval in step 513. The charging measurement interval may be configured as a charging capacity (%) or a charging time, and one or more charging measurement intervals may be configured. For example, the processor may not have a linear charging characteristic in a part of the CC charging interval 410 (for example, an interval having a charging capacity from about 0% to about 20%). The processor may designate the part of the CC charging interval having the linear charging characteristic (for example, an interval in which charging with a charging capacity from about 20% to about 80% is performed) as a charging measurement interval. The charging measurement interval may be designated as one or more intervals. When battery charging is performed in a predetermined charging interval, the processor may acquire charging state information of the battery measured by the power management module in step 515. When the battery charging state is identified, the processor may compare the acquired charging state information with a reference value of the charging measurement interval stored in the memory in step 517. When the comparison result satisfies a predetermined condition, the processor may determine that the battery is in a malfunction state and display the malfunction state through a display module (for example, at least one of the sound output device 155, the display device 160, the audio module 170, and the haptic module 179 of FIG. 1) in step 519. The processor may notify the outside of the malfunction state of the battery through a communication module (for example, the communication module 190 of FIG. 1) or a connection terminal (for example, the connection terminal 178) in step 519. When the battery charging state does not satisfy a predetermined condition, the processor may recognize it in step 517 and return to step 511 to maintain the battery charging operation.

The processor may control the battery charging operation in step 511 and repeatedly perform the operation in the next charging measurement interval. The processor may perform control to switch to the CV charging operation when the battery reaches a predetermined voltage for performing the charging operation in step 511, and may not perform an operation of measuring the charging state when the CV charging operation is performed. When the battery capacity reaches the fully charged state (for example, the state in which the battery voltage reaches about 4.5 V) while the CV charging operation is performed, the processor may end the charging operation.

Figure 6:
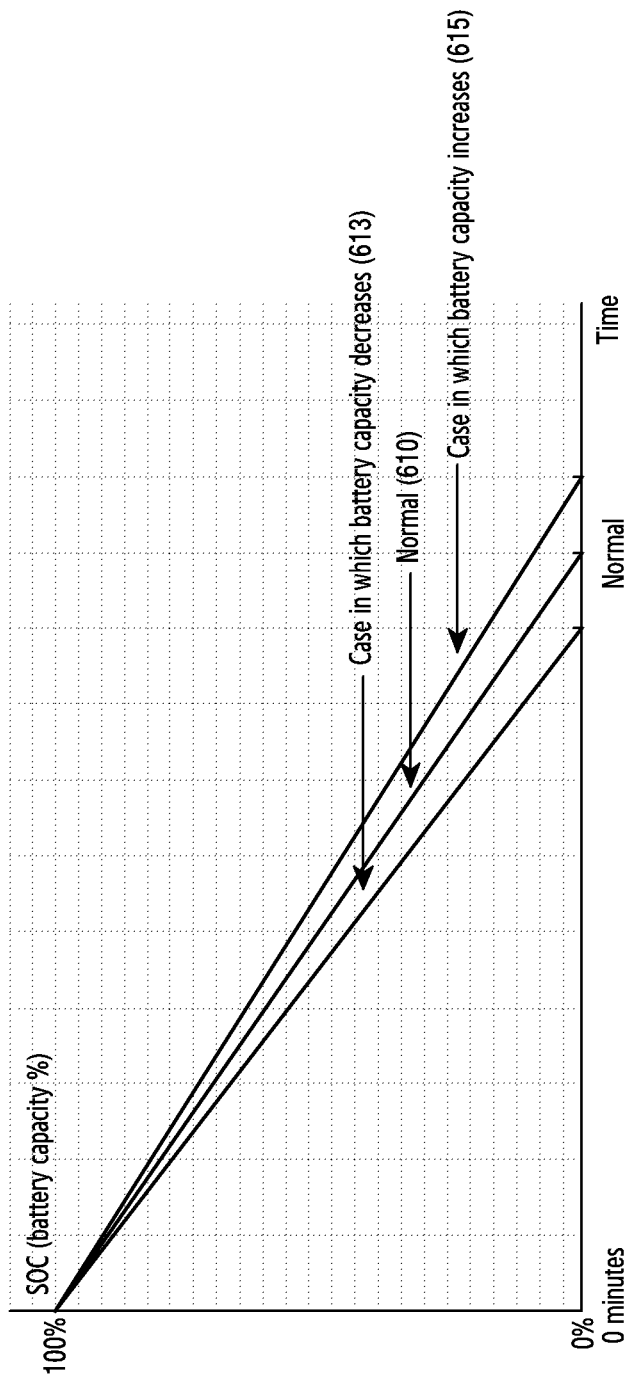
FIG. 6 illustrates a discharging characteristic of a battery in the electronic device according to various embodiments.

FIG. 6 illustrates a discharging characteristic of a battery in an electronic device according to various embodiments.

Referring to FIG. 6, a processor (for example, the processor 120 of FIG. 1 or the processor 310 of FIG. 3) of an electronic device (for example, the electronic device 100 of FIG. 1 or the electronic device 300 of FIG. 3) may perform a predetermined function in the state in which a battery (for example, the battery 189 of FIGS. 1 and 2 or the battery 330 of FIG. 3) is charged. A discharging characteristic may be measured while a predetermined function is performed. When discharging state measurement of the battery is configured, the processor may perform a configured function and configure to linearly reduce battery discharging. For example, when the discharging state measurement is configured, the processor may refrain from performing a function of significantly consuming a discharging current (for example, a game or multimedia reproduction). When a discharging current or a consumption current is constant, a discharging characteristic corresponding to linear reduction (linearly straight line) may appear as illustrated in FIG. 6. When the battery discharging current is constant, a discharging time may vary depending on a battery state. For example, when a normal battery has a discharging characteristic as indicated by reference numeral 610, a discharging characteristic of a battery in a malfunction state (aging or short circuit) may have a characteristic as indicated by reference numeral 613 or 615.

In the operation with a specific discharging current based on the battery discharging characteristic as illustrated in FIG. 6, the processor may designate a part of a specific SOC change interval as a discharging state measurement interval. The processor may measure a battery state on the basis of a time in the designated discharging state measurement interval or a battery capacity and determine the battery state on the basis of the measured result. The battery discharging capacity may have a linear characteristic having a predetermined slope but there may be a non-linear interval near 100% or 0% of the SOC. When a discharging time according to a change in the SOC is calculated, the processor may exclude an interval in which a discharging characteristic is not linear and configure a discharging state measurement interval in an interval having a linear characteristic (for example, an interval in which the SOC is about 30% to about 70%). The processor may acquire battery discharging state information in some SOC intervals while the battery performs a discharging operation and identify the battery state by comparing the acquired discharging state information with a corresponding reference value.

Figure 7:
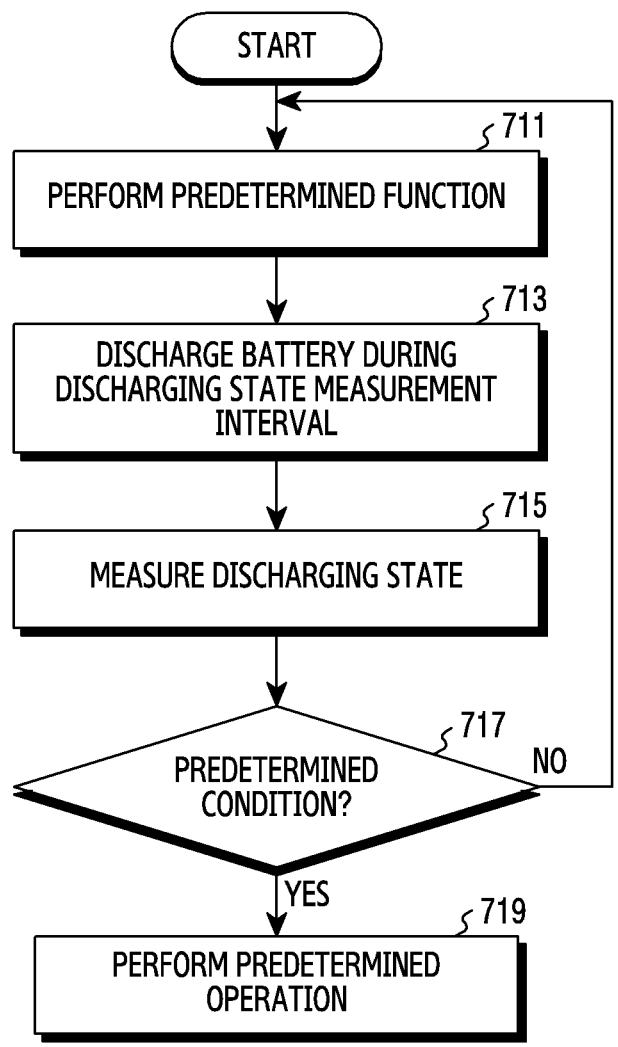
FIG. 7 is a flowchart illustrating an operation in which the electronic device identifies a battery state on the basis of a battery discharging state according to various embodiments.

FIG. 7 is a flowchart illustrating an operation in which an electronic device identifies a battery state on the basis of a battery discharging state according to various embodiments.

Referring to FIG. 7, an electronic device (for example, the electronic device 100 of FIG. 1 or the electronic device 300 of FIG. 3) may perform a predetermined function in step 711. A battery (for example, the battery 189 of FIGS. 1 and 2 or the battery 330 of FIG. 3) may supply operation power to elements for performing a predetermined function. A processor (for example, the processor 120 of FIG. 1 or the processor 310 of FIG. 3) of the electronic device may identify a predetermined discharging state measurement interval in the state in which a predetermined function is performed. The discharging measurement interval may be configured as a battery storage capacity (%) or discharging time, and one or more discharging measurement intervals may be configured. For example, the processor may designate a part of an interval having a linear discharging characteristic (for example, an interval in which a battery storage capacity is about 30% to about 70%) as the discharging measurement interval as illustrated in FIG. 6. One or more discharging measurement intervals may be designated. The processor may measure the battery discharging state in the designated discharging state measurement interval in step 715. When the battery discharging state is identified, the processor may compare the acquired discharging state information with a reference value of the discharging measurement interval stored in the memory in step 717. When the comparison result satisfies a predetermined condition, the processor may determine that the battery is in a malfunction state and display the malfunction state through a display module (for example, at least one of the sound output device 155, the display device 160, the audio module 170, and the haptic module 179 of FIG. 1). The processor may notify the outside of the malfunction state of the battery through a communication module (for example, the communication module 190 of FIG. 1) or a connection terminal (for example, the connection terminal 178) in step 719. When the battery charging state does not satisfy a predetermined condition, the processor may recognize it in step 717 and return to step 711 to continuously perform the predetermined function of the battery.

Figure 8:
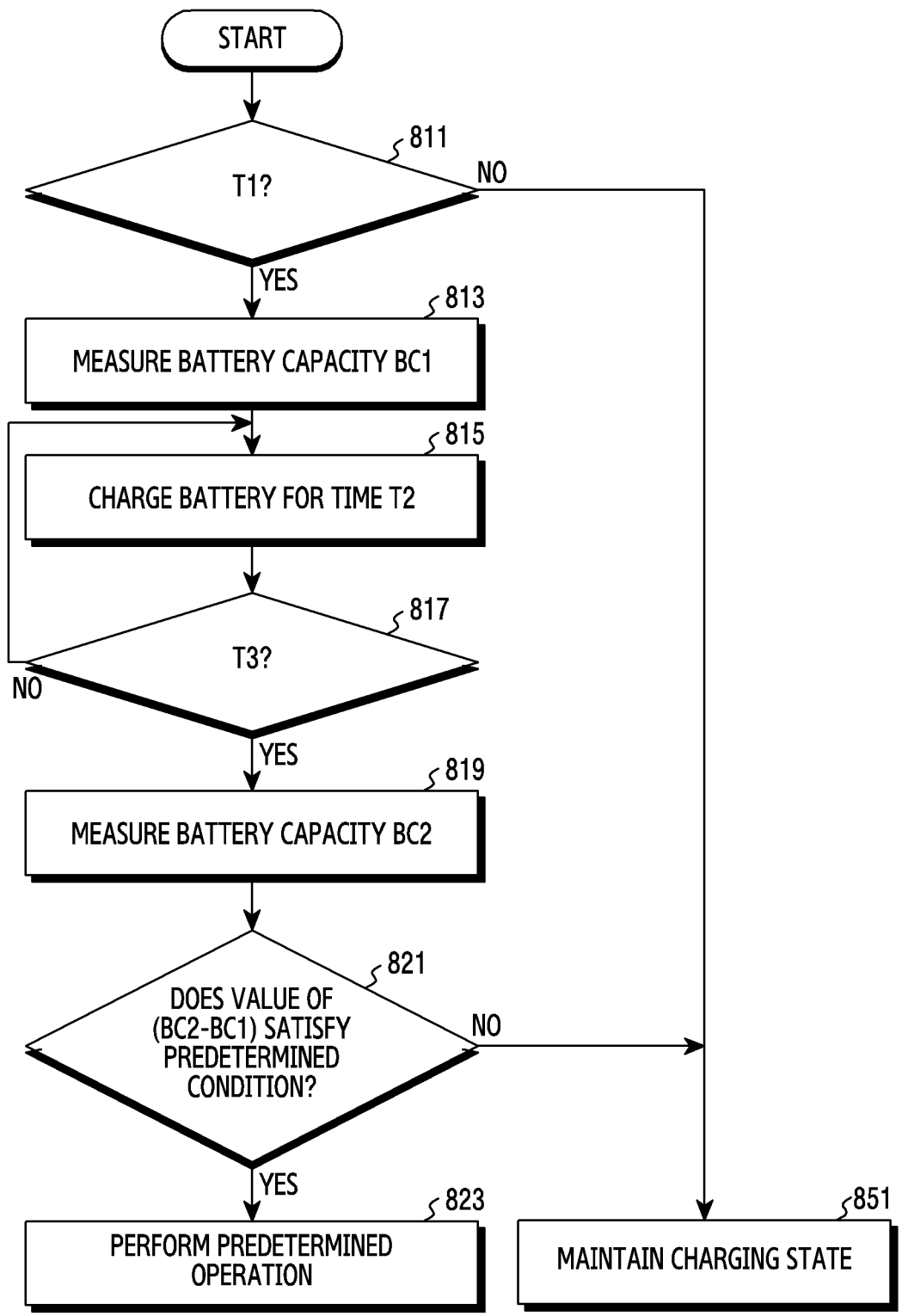
FIG. 8 illustrates an operation in which the electronic device identifies a battery state on the basis of a battery charging time according to various embodiments.

FIG. 8 illustrates an operation in which an electronic device identifies a battery state on the basis of a battery charging time according to various embodiments.

Referring to FIG. 8, a processor (for example, the processor 120 of FIG. 1 or the processor 310 of FIG. 3) of an electronic device (for example, the electronic device 100 of FIG. 1 or the electronic device 300 of FIG. 3) inspects whether a first predetermined time (for example, T1) arrives while a charging operation of a battery (for example, the battery 189 of FIG. 1 and FIG. 2 or the battery 330 of FIG. 3) is performed. When the time T1 is recognized in step 811, the processor may acquire a first capacity (for example, BC1) of the battery charged until the time T1 through a power management module (for example, the power management module 188 of FIG. 1 or the power management module 320 of FIG. 3) in step 815. After acquiring BC1, the processor may perform a battery charging operation during a second predetermined time (T2) in step 815. The processor may recognize a third predetermined time (for example, T3) after the time T2 passes in step 817 and acquire a second capacity (BC2) of the battery charged until the time T3 through the power management module in step 819.

The processor may calculate a difference value (BC2−BC1) between BC1 and BC2 and identify whether the difference value (BC2−BC1) satisfies a predetermined condition in step 821. The predetermined condition may be a condition under which the battery charging operation is abnormally performed. For example, the predetermined condition may be a condition that leaves a normal charging range. When the difference value (BC2-BC1) satisfies a predetermined condition, the processor may determine that the battery is in a malfunction state and perform the predetermined operation in step 823. The predetermined operation may be an operation of displaying the malfunction state through a display module (for example, at least one of the sound output device 155, the display device 160, the audio module 170, and the haptic module 179 of FIG. 1). The predetermined operation may include an operation of informing the outside of the malfunction state of the battery through a communication module (for example, the communication module 190 of FIG. 1) or a connection terminal (for example, the connection terminal 178). When the difference value (BC2−BC1) does not satisfy a predetermined condition, the processor may recognize it in step 821 and proceed to step 851 to maintain the battery charging operation.

Figure 9:
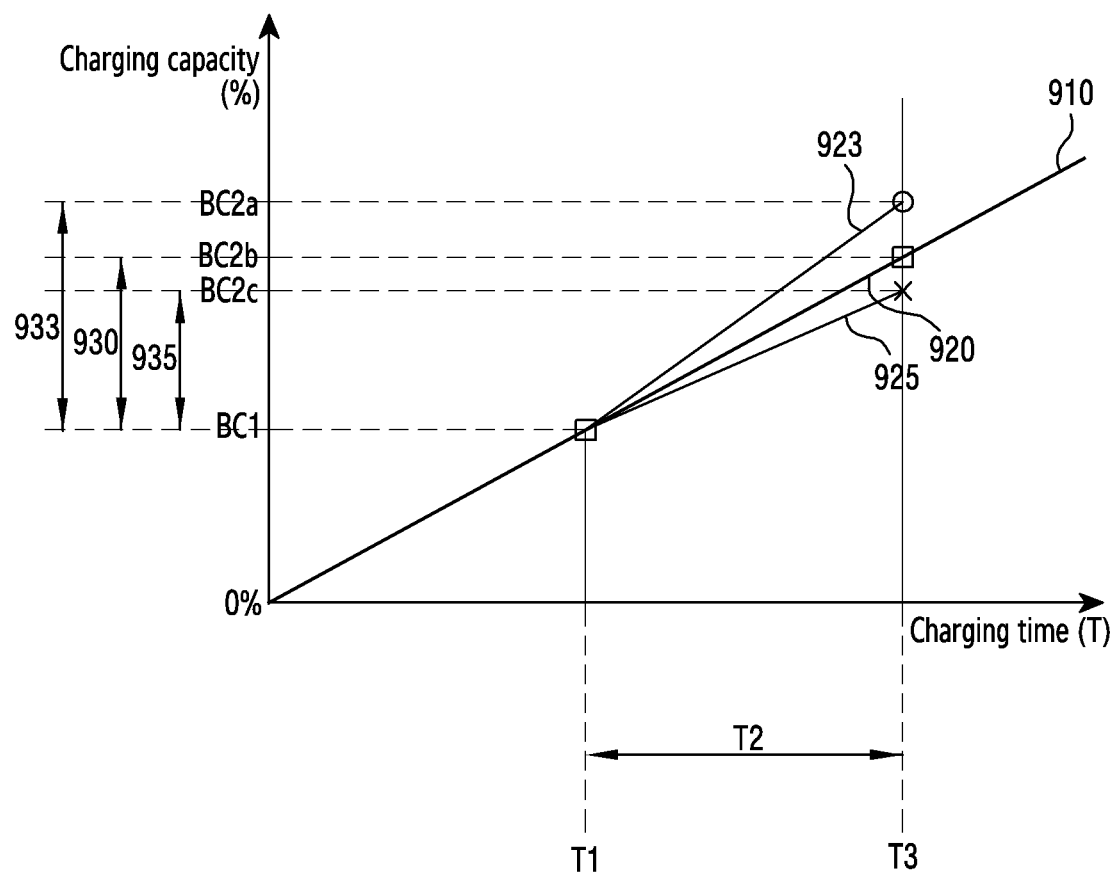
FIG. 9 illustrates an operation in which the electronic device identifies a battery state on the basis of a battery charging time according to various embodiments.

FIG. 9 illustrates an operation in which an electronic device identifies a battery state on the basis of a battery charging time according to various embodiments. FIG. 9 may illustrate the operation performed when the battery is charged through the procedure illustrated in FIG. 8.

Referring to FIG. 9, a normal battery may be charged by a linear characteristic in a CC interval as indicated by reference numeral 910. The processor may designate a part of the CC charging interval as indicated by reference numeral 910 may be designated as a charging state measurement state. The charging state measurement interval may be designated as a charging time. The processor may acquire a first capacity (BC1) of the battery charged until a first predetermined time (for example, T1) and a second capacity (BC2) of the battery charged until a third predetermined time (for example, T3) and, when a value of BC2−BC1 is calculated, obtain a battery charging capacity measured in a second predetermined time (T2) corresponding to the charging state measurement interval. The battery in a normal state may be charged at a slope as indicated by reference numeral 920. For example, a memory of the electronic device may store in advance a capacity value charged in the normal battery in the charging state measurement interval as a reference value. The reference value may be a value (BC2$b$−BC1) as indicated by reference numeral 930 charged at a slope as indicated by reference numeral 920.

A charging capacity measured until the time T1 corresponding to a start time of measuring the charging state may be BC1. Thereafter, in the charging state measurement interval (for example, interval T2), an abnormal battery may be charged at a slope as indicated by reference numeral 923 or 925 and a normal battery may be charged at a slope as indicated by reference numeral 920. In the time T2, the processor may acquire a value BC2$a$ in the case of a battery charged at a slope as indicated by reference numeral 923, acquire a value BC2$b$ in the case of a battery charged with a slope as indicated by reference numeral 920, and acquire a value BC2$c$ in the case of a battery charged at a slope as indicated by reference numeral 925. The processor may compare the battery charging capacity (BC2−BC1) measured in the charging state measurement interval with a reference value stored in the memory and identify whether the comparison result satisfies a predetermined condition. The predetermined condition may mean that the measured battery capacity (BC2−BC1) leaves a reference value range. For example, a value (BC2$a$−BC1) as indicated by reference numeral 933 or a value (BC2$c$−BC1) as indicated by reference numeral 935 calculated through charging at a slope as indicated by reference numeral 923 or 925 may be a value under a predetermined condition, and a value (BC2$b$−BC1) as indicated by reference numeral 930 obtained through charging at a slope as indicated by reference numeral 920 may be a value that leaves the predetermined condition. When the value as indicated by reference numeral 933 or 935 is acquired in the charging state measurement interval, the processor may determine that the battery is in a malfunction state and display the malfunction state to the user. When the value as indicated by reference numeral 930 is acquired, the processor may determine that the battery is in a normal state and continuously maintain the charging operation.

Figure 10:
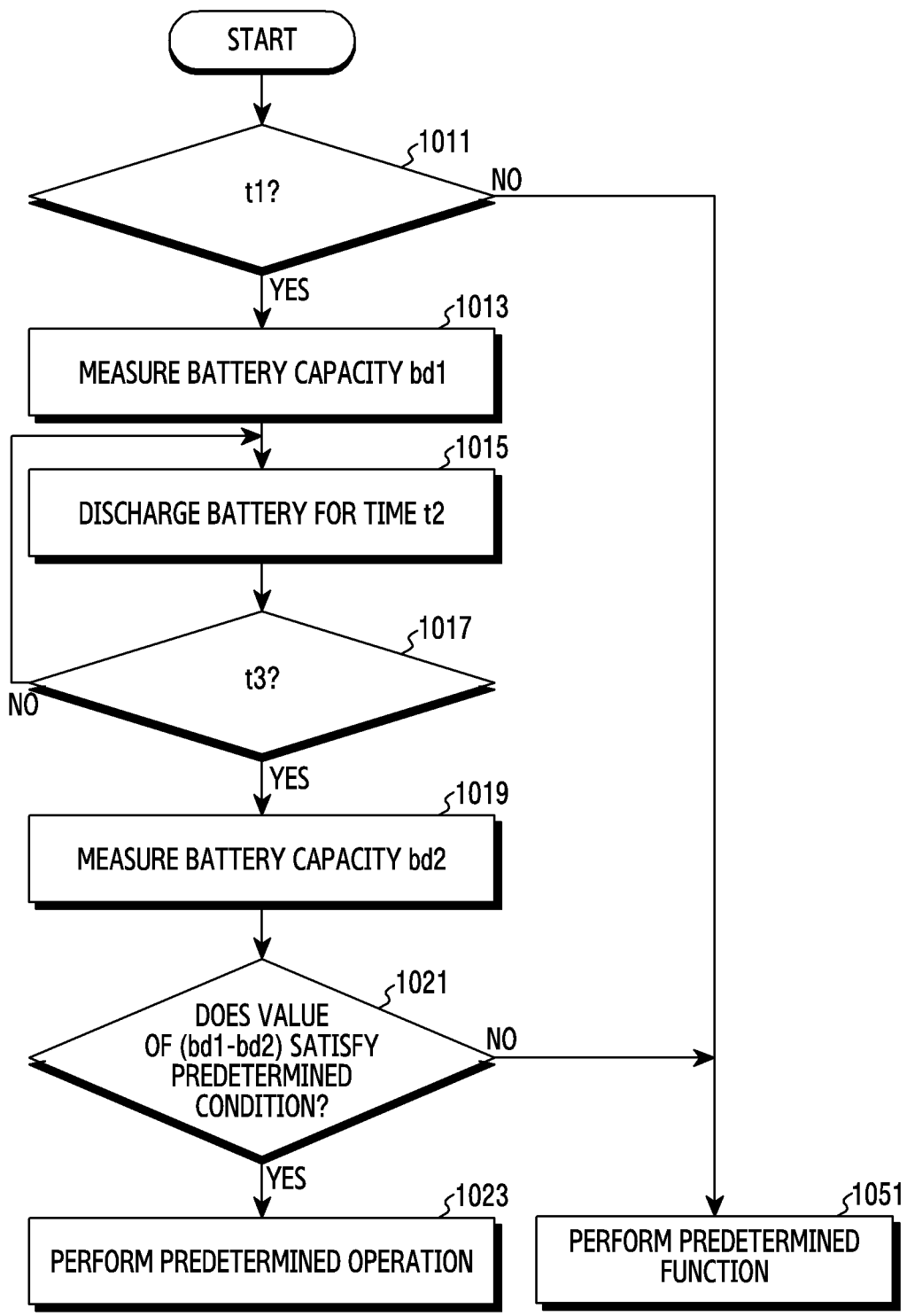
FIG. 10 illustrates an operation in which the electronic device identifies a battery state on the basis of a battery discharging time according to various embodiments.

FIG. 10 illustrates an operation in which an electronic device identifies a battery state on the basis of a battery discharging time according to various embodiments.

Referring to FIG. 10, a processor (for example, the processor 120 of FIG. 1 or the processor 310 of FIG. 3) of an electronic device (for example, the electronic device 100 of FIG. 1 or the electronic device 300 of FIG. 3) inspects whether a first predetermined time (for example, t1) arrives while a predetermined operation is performed. The electronic device may perform a predetermined function using discharged power of a battery (for example, the battery 189 of FIGS. 1 and 2 or the battery 330 of FIG. 3). The predetermined function may be functions performed in the state in which a battery discharging characteristic is measured. When the time t1 is recognized in step 1011, the processor may acquire a first capacity (for example, bd1) of the battery discharged until the time t1 through a power management module (for example, the power management module 188 of FIG. 1 or the power management module 320 of FIG. 3) in step 1015. After acquiring bd1, the processor may perform an operation of performing a predetermined function during a second predetermined time (t2) in step 1015. In the state in which the predetermined function is performed, the battery may supply operation power and perform a discharging operation. The battery discharging characteristic may be a characteristic of linearly reducing power. The processor may recognize a third predetermined time (for example, t3) after the time t2 passes in step 1017 and acquire a second capacity (bd2) of the battery discharged until the time t3 through the power management module in step 1019.

After calculating the difference value (bd1−bd2) between bd1 and bd2, the processor may identify whether the difference value (bd1−bd2) satisfies a predetermined condition in step 1021. The predetermined condition may be a condition under which a battery discharging operation is abnormally performed. For example, the predetermined condition may be a condition that leaves a normal discharging range. When the difference value (bd1−bd2) satisfies the predetermined condition, the processor may determine that the battery is in a malfunction state and perform a predetermined operation in step 1023. The predetermined operation may be an operation of displaying the malfunction state through a display module (for example, at least one of the sound output device 155, the display device 160, the audio module 170, and the haptic module 179 of FIG. 1). The predetermined operation may include an operation of informing the outside of the malfunction state of the battery through a communication module (for example, the communication module 190 of FIG. 1) or a connection terminal (for example, the connection terminal 178). When the difference value (bd1−bd2) does not satisfy the predetermined condition, the processor may recognize it in step 1021 and proceed to step 1051 to maintain the battery discharging operation.

Figure 11:
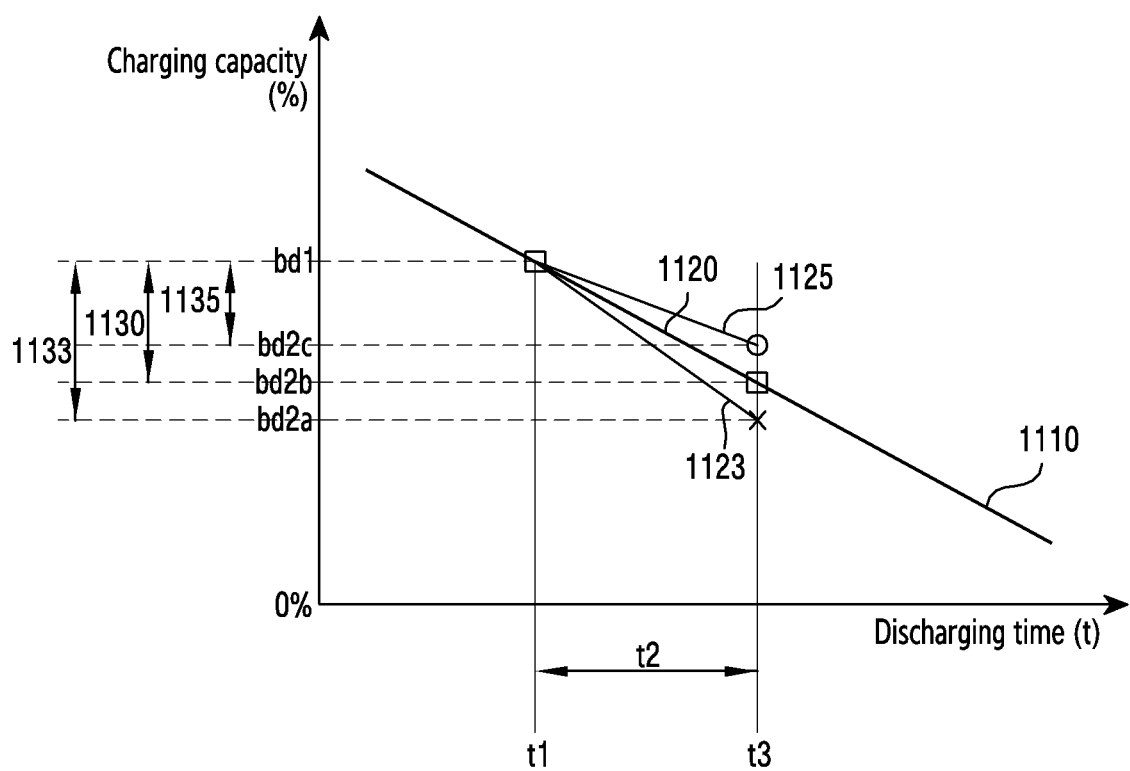
FIG. 11 illustrates an operation in which the electronic device identifies a battery state on the basis of a battery discharging time according to various embodiments.

FIG. 11 illustrates an operation in which an electronic device identifies a battery state on the basis of a battery discharging time according to various embodiments. FIG. 11 illustrates an operation of discharging a battery through the procedure illustrated in FIG. 10.

Referring to FIG. 11, a normal battery may be discharged with a linear characteristic as indicated by reference numeral 1110 in the state in which a predetermined function is performed. The processor may designate a part of the discharging interval as indicated by reference numeral 1110 as a discharging state measurement interval. The discharging state measurement interval may be designated as a discharging time. The processor may acquire a first capacity bd1 of the battery discharged until a first predetermined time (for example, t1), acquire a second capacity bd2 of the battery discharged until third predetermined time (for example, t3), and when a value of (bd1−bd2) is calculated, calculate a battery discharging capacity measured in a second predetermined time (t2) corresponding to the discharging state measurement interval. The battery in the normal state may be discharged at a slope as indicated by reference numeral 1120. A reference value for identifying a battery state may be a value of (bd1−bd2b) as indicated by reference numeral 1130 discharged at the slope as indicated by reference numeral 1120 in FIG. 10.

The discharging capacity measured until the time t1 of starting measuring the discharging state may be bd1. Thereafter, when the battery is in an abnormal state in the discharging state measurement interval (for example, interval t2), the battery may be discharged at a slope indicated by reference numeral 1123 or 1125. In the time t2, the processor may a value of bd2a when the battery is discharged at a slope as indicated by reference numeral 1123, acquire a value of bd2b when the battery is discharged at a slope as indicated by reference numeral 1120, and acquire a value of bd2c when the battery is discharged at a slope as indicated by reference numeral 1125. The processor may compare the battery discharging capacity (bd1−bd2) measured in the discharging state measurement interval with a reference value stored in the memory and identify whether the battery discharging capacity satisfies a predetermined condition. The predetermined condition may mean that the measured battery capacity (bd2−bd1) leaves a reference value range. For example, a value of (bd1−bd2a) as indicated by reference numeral 1133 or a value of (bd1−bd2c) as indicated by reference numeral 1135, discharged at a slope as indicated by reference numeral 1123 or 1125 may be a value within the predetermined condition, and a value of (bd1−bd2b) as indicated by reference numeral 1130, discharged at a slope as indicated by reference numeral 1120 may be a value beyond the predetermined condition. When the value as indicated by reference numeral 1133 or 1135 is calculated in the discharging state measurement interval, the processor may determine that the battery is in a malfunction state and display the malfunction state to the user. When the value as indicated by reference numeral 1130 is acquired, the processor may determine that the battery is in a normal state and supply battery power to each element as operation power.

Figure 12:
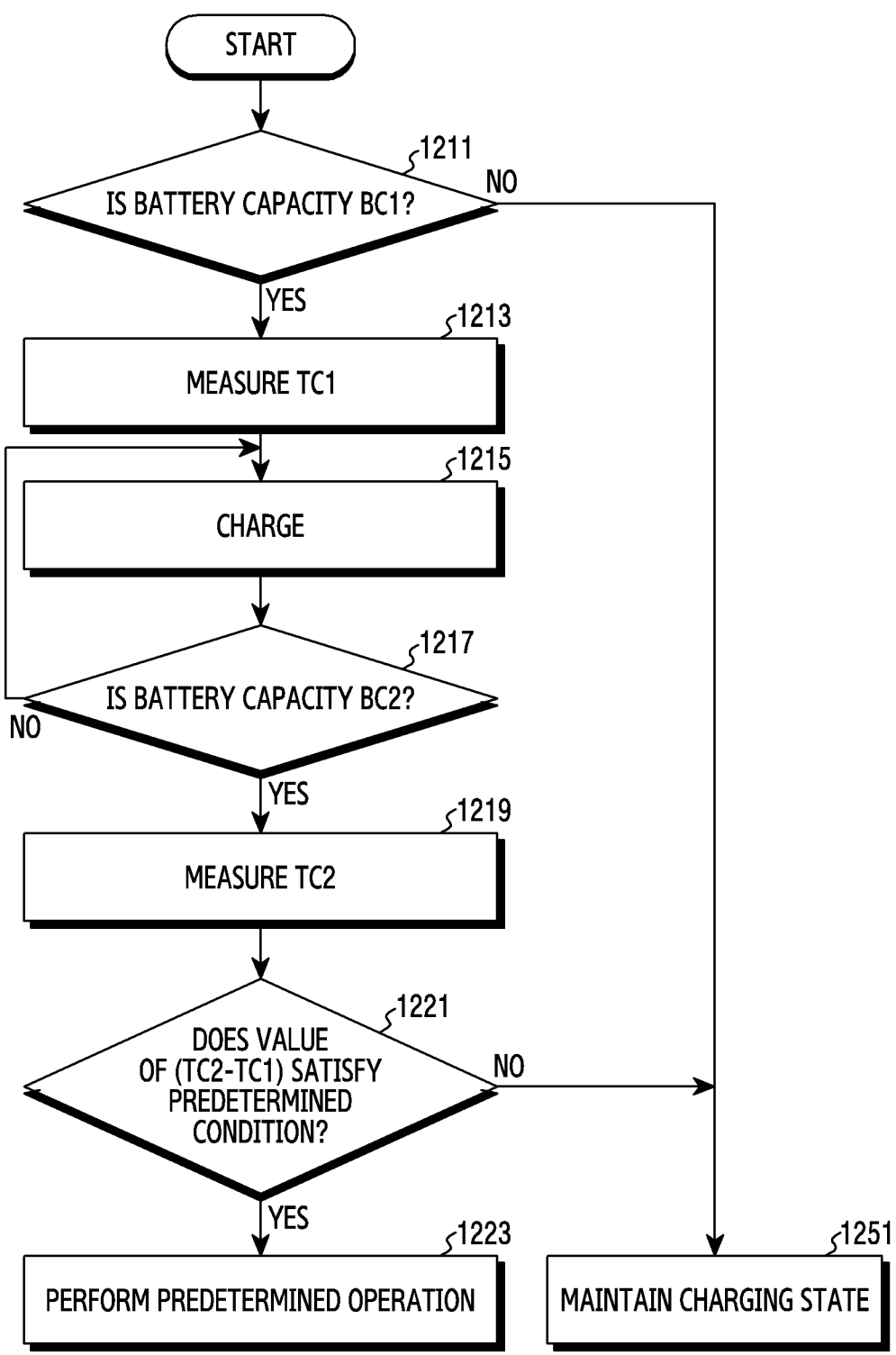
FIG. 12 illustrates an operation in which the electronic device identifies a battery state on the basis of a battery charging capacity according to various embodiments.

FIG. 12 illustrates an operation in which an electronic device identifies a battery state on the basis of a battery charging capacity according to various embodiments.

Referring to FIG. 12, a processor (for example, the processor 120 of FIG. 1 or the processor 310 of FIG. 3) of an electronic device (for example, the electronic device 100 of FIG. 1 or the electronic device 300 of FIG. 3) inspects a battery charging capacity while a charging operation of a battery (for example, the battery 189 of FIGS. 1 and 2 or the battery 330 of FIG. 3) is performed. The processor may identify a battery charging capacity charged through a power management module (for example, the power management module 188 of FIG. 1 or the power management module 320 of FIG. 3) in step 1211. When charging of the battery with a first capacity (for example, BC1) is recognized in step 1211, the processor identifies a first charging time (for example, TC1) charged until BC1 in step 1213. After identifying TC1, the processor may perform the battery charging operation step 1215. When the battery is charged with a second charging capacity (for example, BC2), the processor may recognize it and identify a second charging time (for example, TC2) charged until BC2 in step 1219.

The processor may calculate a difference value of the charging time between BC1 and BC2 (for example, TC2−TC1) in step 1221 and inspect whether the value of (TC2−TC1) satisfies a predetermined condition. When the value of (TC2−TC1) satisfies the predetermined condition, the processor may perform a predetermined operation in step 1223. For example, the predetermined operation may be an operation in which the processor displays a battery malfunction state on the display. For example, the predetermined operation may be an operation of controlling battery charging. When the value of (TC2−TC1) does not satisfy the predetermined condition, the processor may maintain the battery charging operation in step 1251.

Figure 13:
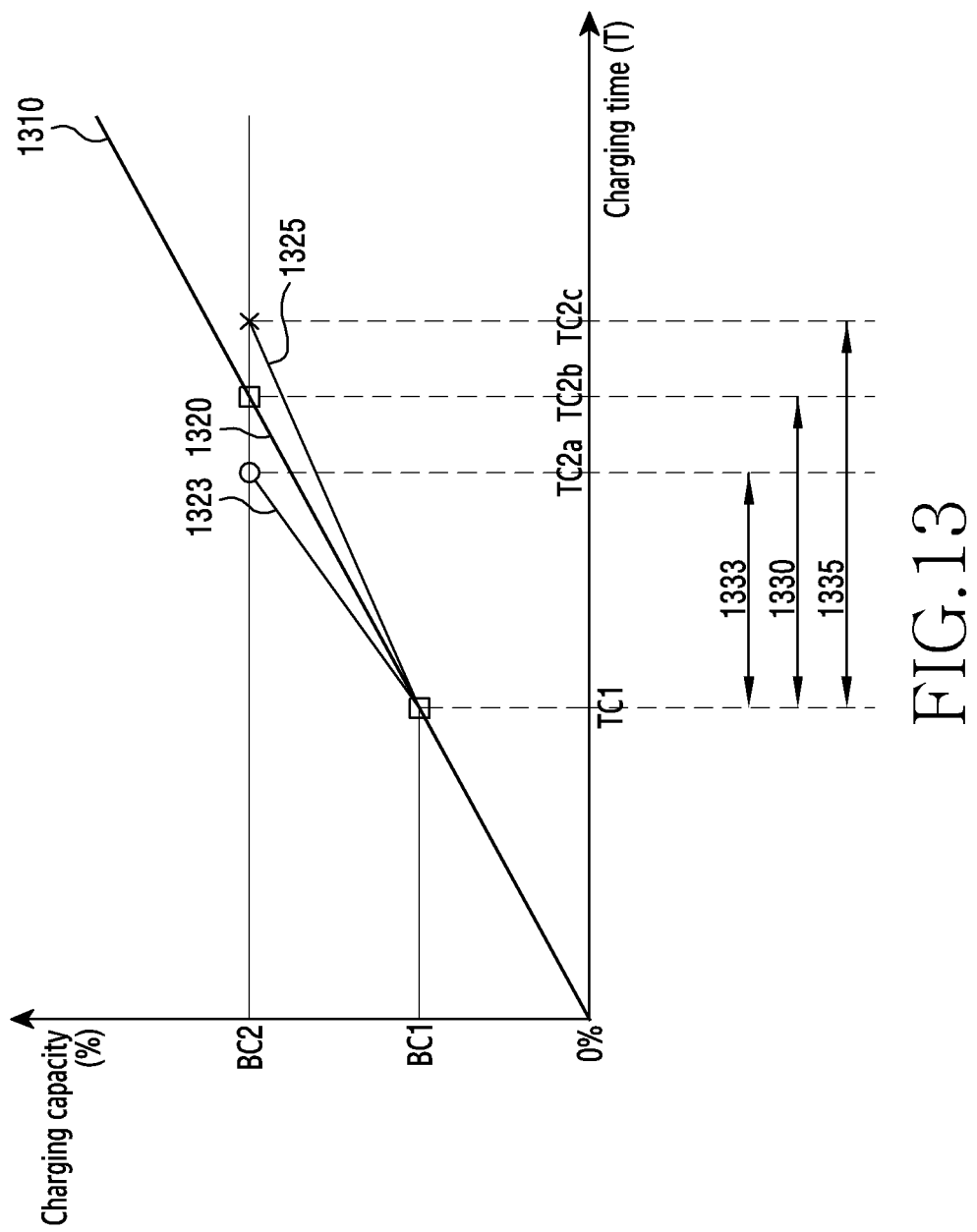
FIG. 13 illustrates an operation in which the electronic device identifies a battery state on the basis of a battery charging capacity according to various embodiments.

FIG. 13 illustrates an operation in which an electronic device identifies a battery state on the basis of a battery charging capacity according to various embodiments. FIG. 13 illustrates an operation of charging the battery through the procedure illustrated in FIG. 12.

Referring to FIG. 13, a normal battery may be charged by a linear characteristic as indicated by reference numeral 1310 in a CC interval. The processor may designate a part of the CC charging interval as indicated by reference numeral 1310 as a charging state measurement state. The charging state measurement interval may be configured on the basis of a battery charging capacity. The processor may acquire a first charging time (TC1) spent for charging the battery with a first capacity (BC1) and a second charging time spent for charging the battery with a second capacity (BC2) and, when a value of (TC2−TC1) is calculated, calculate a charging time spent for charging a predetermined battery capacity in the charging state measurement interval. The battery in a normal state may be charged at a slope as indicated by reference numeral 1320. For example, the memory of the electronic device may store in advance a reference time value of charging of the normal battery in the charging state measurement interval. The reference value may be a value of (TC2b−TC1) as indicated by reference numeral 1330, charged at a slope as indicated by reference numeral 1320 in FIG. 13.

The battery charging capacity BC1 may be a first predetermined capacity (a start location of the charging state measurement interval) of the charging state measurement interval. Thereafter, the battery may perform a charging operation, and the processor may identify a battery charging capacity through a power management module. In the charging state measurement interval, an abnormal battery may be charged at a slope as indicated by reference numeral 1323 or 1325 and a normal battery may be charged at a slope as indicated by reference numeral 1320. In BC2 of the battery, the processor may acquire a value of TC2a in the case of a battery charged at the slope as indicated by reference numeral 1323, acquire a value of TC2b in the case of a battery charged at the slope as indicated by reference numeral 1320, and acquire a value of TC2c in the case of a battery charged at the slope as indicated by reference numeral 1325. The processor may compare the battery charging time difference (TC2−TC1) measured in the charging state measurement interval with a reference value stored in the memory and identify whether the battery charging time difference satisfies a predetermined condition. The predetermined condition may mean that the measured battery capacity (BC2−BC1) leaves a reference value range. For example, a value of (TC2a−TC1) as indicated by reference numeral 1333 or a value of (TC2c−TC1) as indicated by reference numeral 1335, charged with a slope as indicated by reference numeral 1323 or 1325 may be a value under a predetermined condition, and a value of (TC2b−TC1) as indicated by reference numeral 1330, charged with a slope as indicated by reference numeral 1320 may be a value beyond the predetermined condition. When the value as indicated by reference numeral 1333 or 1335 is obtained in the charging state measurement interval, the processor may determine that the battery is in a malfunction state, and provide information related thereto to the user. When the value as indicated by reference numeral 1330 is obtained, the processor may determine that the battery is in a normal state and continuously maintain the charging operation.

Figure 14:
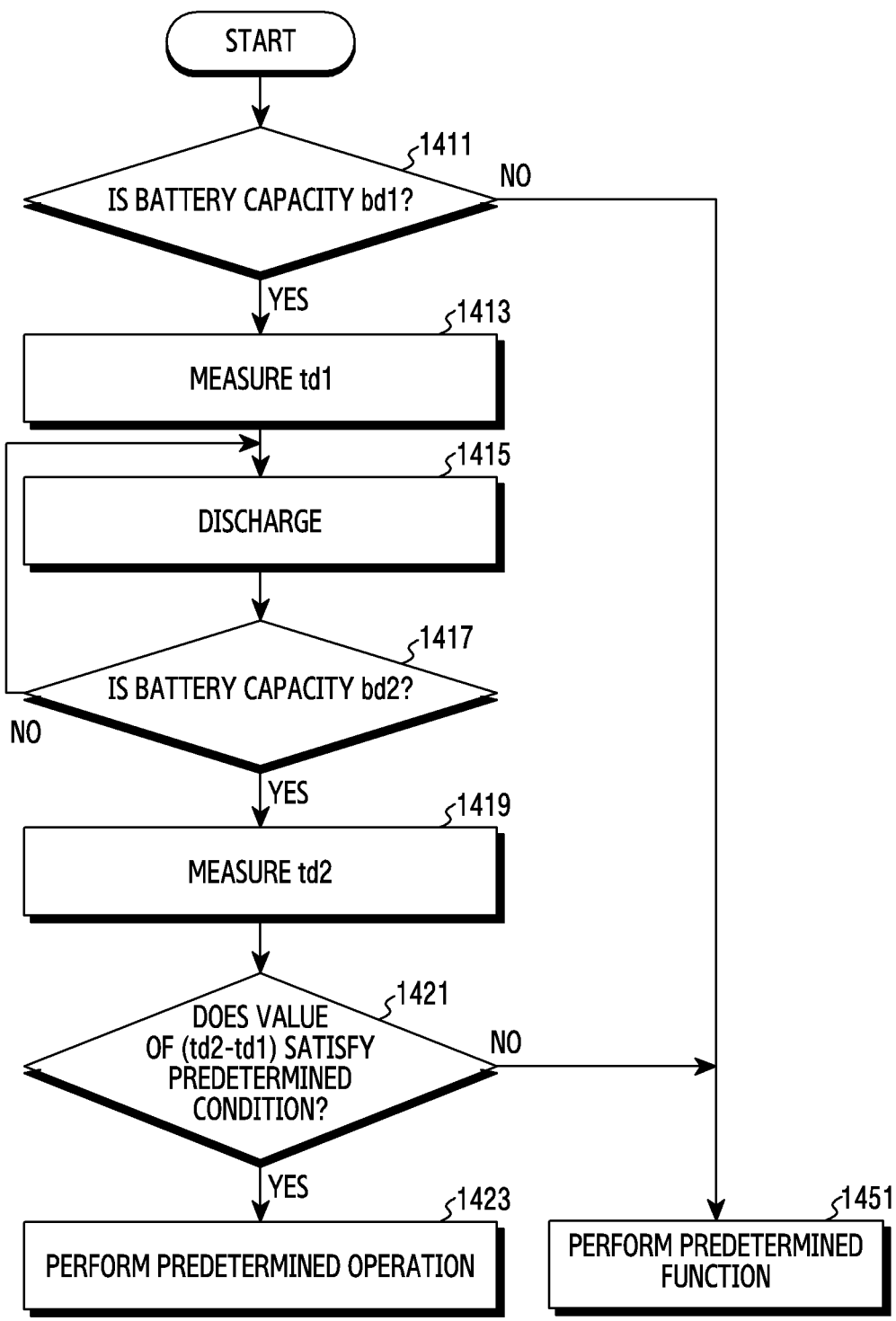
FIG. 14 illustrates an operation in which the electronic device identifies a battery state on the basis of a battery discharging capacity according to various embodiments.

FIG. 14 illustrates an operation in which an electronic device identifies a battery state on the basis of a battery charging capacity according to various embodiments.

Referring to FIG. 14, a processor (for example, the processor 120 of FIG. 1 or the processor 310 of FIG. 3) of an electronic device (for example, the electronic device 100 of FIG. 1 or the electronic device 300 of FIG. 3) inspects a capacity of a battery (for example, the battery 189 of FIGS. 1 and 2 or the battery 330 of FIG. 3) while performing a predetermined function. When a battery capacity becomes a first predetermined battery capacity (for example, bd1) in the state in which the predetermined function is performed, the processor may recognize a start of a discharging state measurement interval in step 1411. When the battery capacity becomes bd1, the processor may measure a first discharging time (for example, td1) of bd1 in step 1413. The processor may perform the predetermined function by battery power and identify a consumed battery capacity through a power management module in step 1415. When the battery capacity becomes a second predetermined battery capacity (for example, bd2) while the predetermined function is performed, the processor may recognize it in step 1417. The processor may measure a discharging time (td2) at the time point of bd2 in step 1417.

The processor may calculate a value of (td2−td1) and identify whether the value of (td2−td1) is a value under a predetermined condition in step 1421. When the value of (td2−td1) satisfies the predetermined condition, the processor may perform a predetermined operation in step 1423. When the value of (td2−td1) does not satisfy the predetermined condition, the processor may perform a predetermined function in step 1451.

Figure 15:
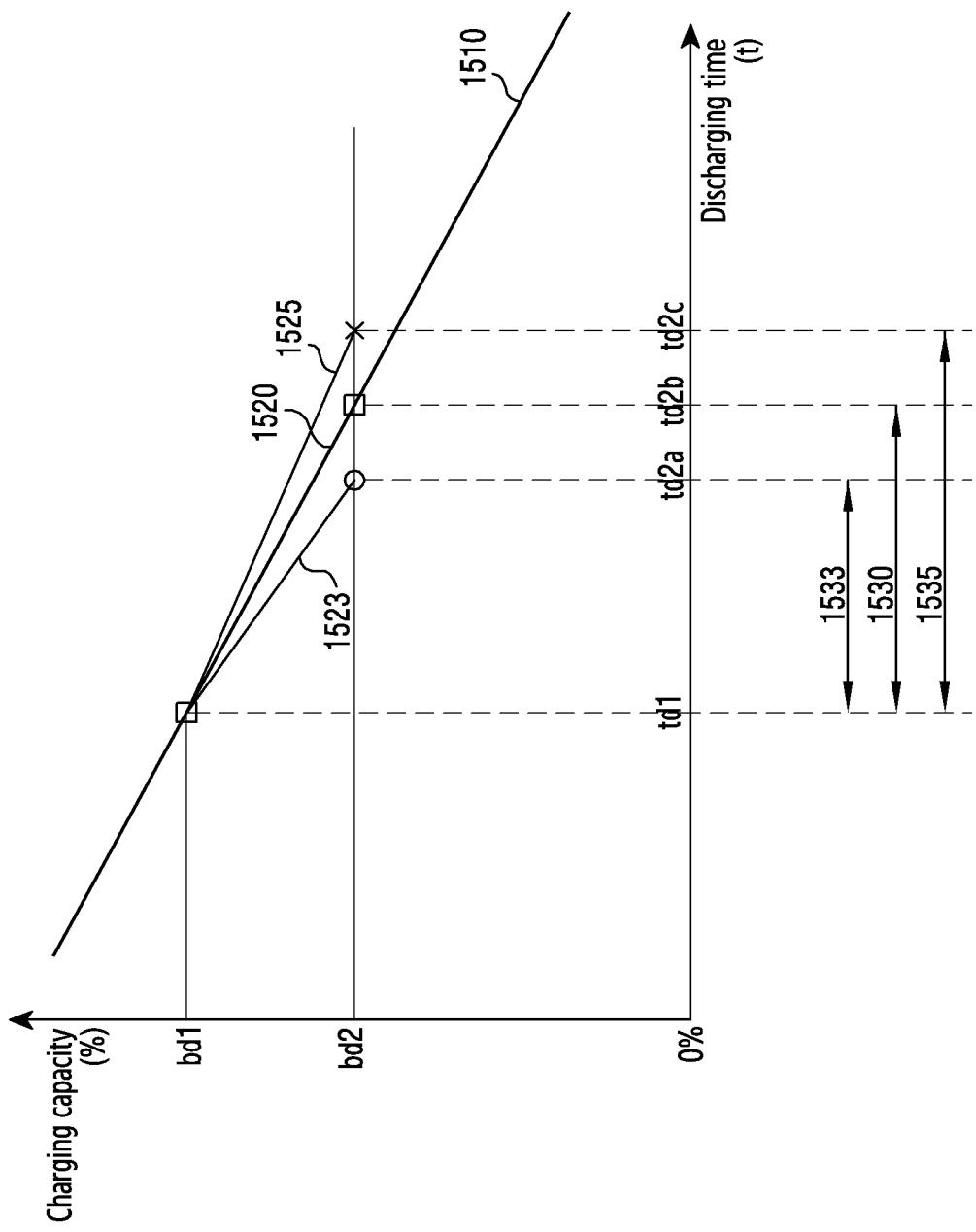
FIG. 15 illustrates an operation in which the electronic device identifies a battery state on the basis of a battery discharging capacity according to various embodiments.

FIG. 15 illustrates an operation in which an electronic device identifies a battery state on the basis of a battery discharging capacity according to various embodiments. FIG. 15 illustrates an operation when the battery is discharged through the procedure illustrated in FIG. 14.

Referring to FIG. 15, a normal battery may be discharged by a linear characteristic as indicated by reference numeral 1510 in the state in which a predetermined function is performed. The processor may designate a part of the discharging interval as indicated by reference numeral 1510 as a discharging state measurement interval. The discharging state measurement interval may be designated as a battery discharging capacity. For example, the discharging state measurement interval may be designated as an interval between bd1 and bd2. The processor may calculate td1 at the time point at which the battery capacity is bd1 and calculate td2 at the time point at which the battery capacity is bd2. The processor may compare the value of (td2−td1) with a reference time value stored in the memory and identify a battery state. The battery in the normal state may be discharged at a slope as indicated by reference numeral 1520. The reference value for identifying the battery state may be a value of (td2b−td1) as indicated by reference numeral 1530, discharged at a slope as indicated by reference numeral 1520.

The discharging state measurement interval may start at the time point at which the battery capacity is bd1. Thereafter, in the discharging state measurement interval, an abnormal battery may be discharged at a slope as indicated by reference numeral 1523 or 1525. The processor may acquire a value of td2a in the case of a battery discharged at the slope as indicated by reference numeral 1526, acquire a value of td2b in the case of a battery discharged at the slope as indicated by reference numeral 1520, and acquire the value of td2c in the case of a battery at the slope as indicated by reference numeral 1525. The processor may compare a discharging time difference (td2−td1) of the discharging state measurement interval with the reference value stored in the memory and identify whether the discharging time difference satisfies a predetermined condition. The predetermined condition may mean that the battery discharging time (td2−td1) measured in the discharging state measurement interval leaves a reference time value range. For example, a value of (td2a−td1) as indicated by reference numeral 1533 or a value of (td2c−td1) as indicated by reference numeral 1535, discharged at the slope as indicated by reference numeral 1523 or 1525 may be a value under a predetermined condition, and a value of (td2b−td1) as indicated by reference numeral 1530, discharged at the slope as indicated by reference numeral 1520 may be a value beyond the predetermined condition. Upon acquiring the value as indicated by reference numeral 1533 or 1535 in the discharging state measurement interval, the processor may determine that the battery is in a malfunction state and provide information related thereto to the user. For example, the processor may provide information related to a battery malfunction state to the user through a notification device (vibration or sound) and/or a display device. Upon acquiring the value as indicated by reference numeral 1530 in the discharging state measurement interval, the processor may determine that the battery is in a normal state and supply battery power to each element as operation power.

Figure 16:
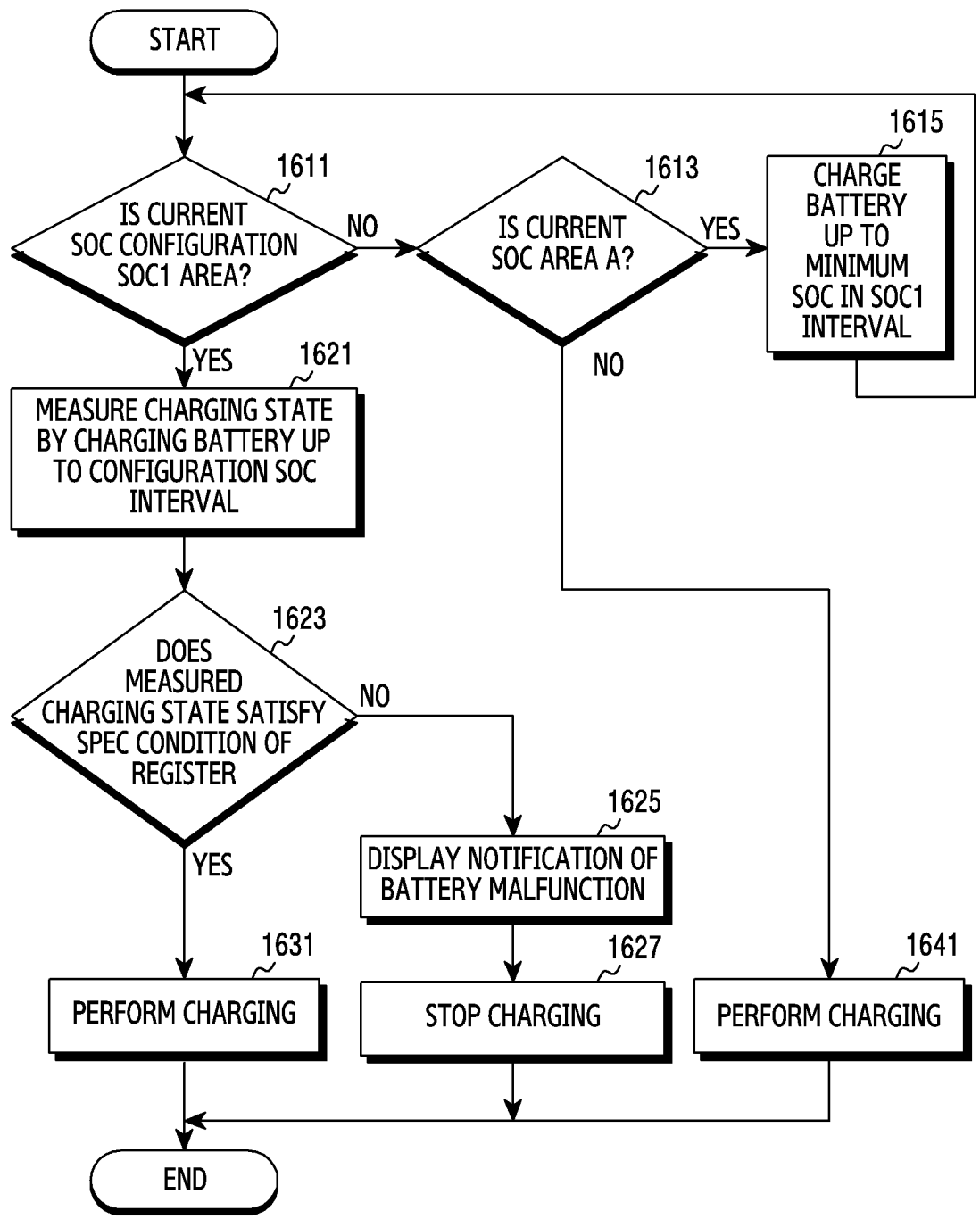
FIG. 16 is a flowchart illustrating an example in which the electronic device identifies a battery state on the basis of battery charging according to various embodiments.

FIG. 16 is a flowchart illustrating an example in which an electronic device identifies a battery state on the basis of battery charging according to various embodiments.

Referring to FIG. 16, an algorithm for identifying a battery state may have the following characteristic. An algorithm operation area may be A<SOC1<B. SOC1 may be a charging interval (for example, CC charging interval) in which the corresponding algorithm can operate to verify the battery. A configuration SOC interval may be a charging state measurement interval. The SOC1 interval may have one or more configuration SOC intervals. The configuration SOC interval may be configured on the basis of the charging time (for example, T1, T2, and T3 of FIGS. 8 and 9) and/or the charging capacity (for example, BC1 and BC2 of FIGS. 12 and 13). Areas A and B may be SOC areas in which the algorithm cannot operate. The memory may include a reference value based on the charging time and/or the charging capacity. For example, when the configuration SOC interval is about 5%, a charging time or a charging capacity may be measured and stored as a reference value when an SOC value of a normal battery changes by about 5%, and the stored reference value may be determined as the spec when the battery state is measured. When the algorithm for identifying the battery state is performed, the battery state may be identified through checking whether the charging time or the charging capacity of the measured configuration SOC interval is within the spec.

When the connection to a charging device (for example, the charging device 390 of FIG. 3) is recognized, a processor (for example, the processor 120 of FIG. 1 or the processor 310 of FIG. 3) of an electronic device (for example, the electronic device 100 of FIG. 1 or the electronic device 300 of FIG. 3) may perform a charging operation of a battery (for example, the battery 189 of FIGS. 1 and 2 or the battery 330 of FIG. 3). When the charging operation is performed, the processor may measure a battery charging capacity. When the battery measurement capacity has a value of area A, the processor may recognize it in step 1613, and perform a CC charging operation up to a minimum SOC interval of the SOC1 interval (for example, a charging capacity equal to or lower than about 20%) by controlling a power management module in step 1615.

When the battery charging capacity is in the SOC1 interval, the processor may recognize it in step 1611 and measure the charging state in the configuration SOC interval in step 1621. The configuration SOC interval may be configured by a predetermined charging time (or charging capacity). The processor may acquire a battery charging capacity (or charging time) measured in a predetermined charging time (or charging capacity). The processor may compare the battery charging capacity (or charging time) measured in the configuration SOC interval with the spec stored in the memory and identify whether the battery charging capacity is under a predetermined condition in step 1623. When the battery charging capacity satisfies a predetermined condition, the processor may determine that the battery is in a malfunction state and provide relevant information to the user in step 1625, and stop charging in step 1627. For example, the processor may provide information related to the battery malfunction state to the user through a notification device (vibration or sound) and/or a display device. When the battery charging capacity does not satisfy the predetermined condition, the processor may continuously perform the charging operation in step 1631. When a plurality of configured SOC intervals is included in the SOC1 interval, the processor may repeatedly perform the operation in the corresponding configured SOC interval.

When the current SOC is area B, the processor may recognize it in step 1613, and end a CC charging operation and perform a CV charging operation in step 1641. When the CV charging operation is performed, the processor may not perform an operation of measuring the battery charging state.

For example, it is assumed that the algorithm operation area is about 20%<SOC1<about 80%, the configuration SOC interval is about 5%, a charging time of about 5% of the SOC of the normal battery is 10 minutes, and a reference value stored in the memory is 8 minutes to 12 minutes when about 5% is charged.

When the user connects a charging device to an electronic device including a battery of about 11% of the SOC, the processor may perform CC charging until the SOC is measured as 20% in steps 1613 and 1615. When the configuration SOC is configured as about 20% to about 25% and the SOC of the battery becomes about 20%, the processor may recognize the SOC1 interval in step 1611 and measure a time during which charging is performed from about 20% to about 25% corresponding to the configuration SOC interval in step 1621. When the measured time is 6 minutes, the processor may recognize a predetermined condition that leaves a reference value range in step 1623 and displays a battery malfunction state. At this time, displayed information may be information suggesting visit to a service center.

Figure 17:
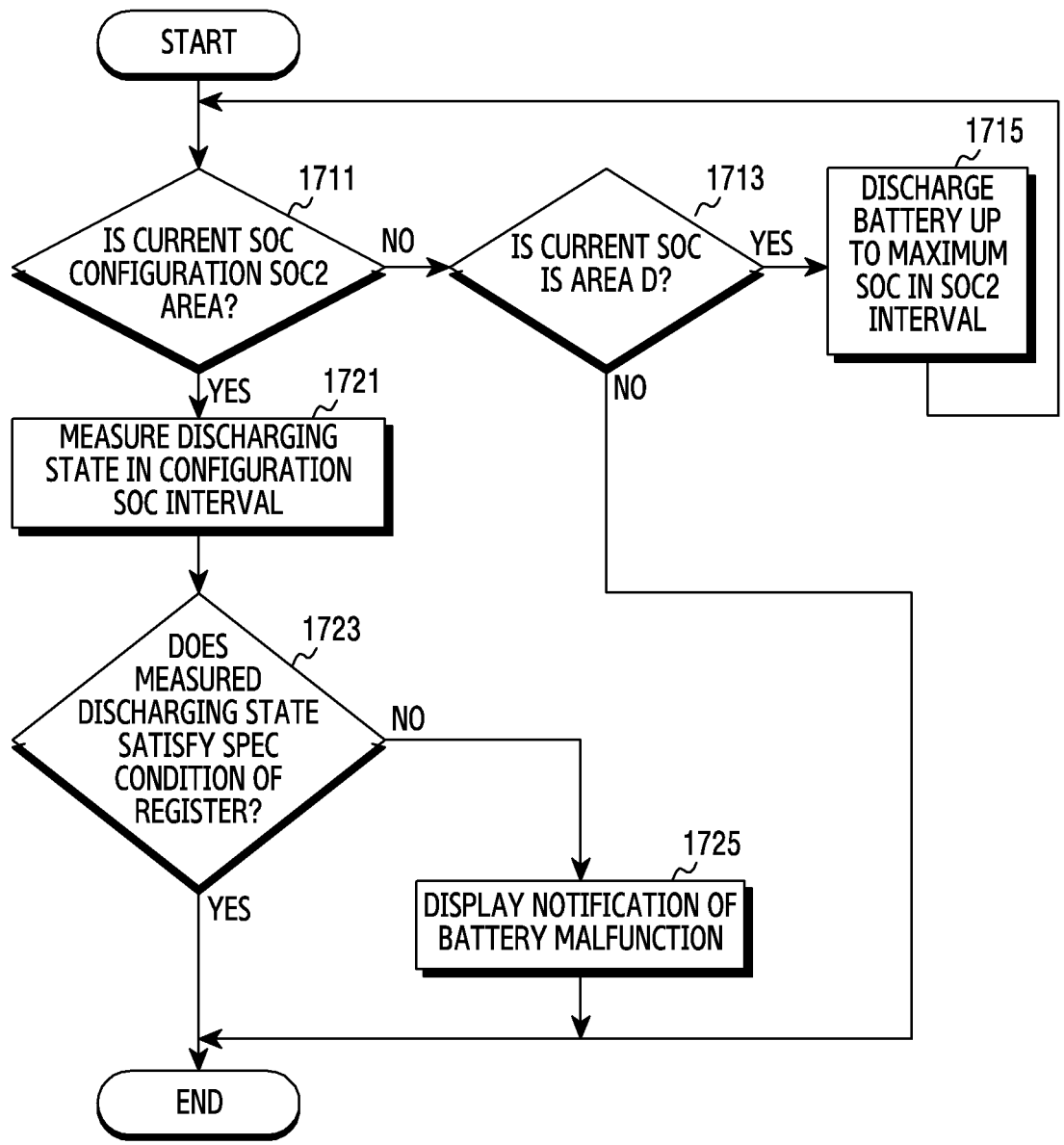
FIG. 17 is a flowchart illustrating an example in which the electronic device identifies a battery state on the basis of battery discharging according to various embodiments.

FIG. 17 is a flowchart illustrating an example in which an electronic device identifies a battery state on the basis of battery discharging according to various embodiments.

Referring to FIG. 17, an algorithm for identifying a battery state may have the following characteristic. An algorithm operation area may be C<SOC2<D. SOC2 may be a discharging interval in which the corresponding algorithm can operate to verify the battery. The configuration SOC interval may be a discharging state measurement interval. The SOC2 interval may have one or more configuration SOC intervals. The configuration SOC interval may be configured on the basis of a discharging time (for example, td1, td2, and td3 of FIGS. 10 and 11) and/or a discharging capacity (for example, bd1 and bd2 of FIGS. 12 and 13). Areas C and D may be SOC areas in which the algorithm cannot operate. When the algorithm for identifying the battery state on the basis of the battery discharging time or discharging capacity is performed, a fixed discharging current may be generated to acquire a linear discharging characteristic during discharging. For example, the algorithm for determining the battery state may be configured to be executed according to user selection or in the state such as a sleeping mode. When the algorithm for determining the battery state is performed, the processor may control the battery to generate the fixed discharging current by executing applications having a predetermined function. The memory may include a reference value based on the discharging time and/or the discharging capacity. For example, when the configuration SOC interval is about 5% and the SOC value of the normal battery is changed by about 5%, the discharging time or the discharging capacity may be measured and stored as a reference value, and the stored reference value may be determined as the spec when the battery state is measured. When the algorithm for identifying the battery state is performed, it may be identified whether the discharging time or the discharging capacity of the measured configuration SOC interval is within the spec.

A processor (for example, the processor 120 of FIG. 1 or the processor 310 of FIG. 3) of an electronic device (for example, the electronic device 100 of FIG. 1 or the electronic device 300 of FIG. 3) may supply power of a battery (for example, the battery 189 of FIGS. 1 and 2 or the battery 330 of FIG. 3) as operation power of the electronic device. When the algorithm for measuring the battery state is selected, the processor may perform a predetermined function and measure a battery capacity. When the battery capacity has a value of area D, the processor may recognize it in step 1713 and discharge the battery up to a maximum SOC interval (for example, a battery capacity equal or lower than about 70%) in the SOC2 interval by controlling a power management module in step 1715. When the battery capacity corresponds to the SOC2 interval, the processor may recognize it in step 1711 and measure a discharging state in the configuration SOC interval in step 1721. The configuration SOC interval may be configured by a predetermined discharging time (or discharging capacity). The processor may acquire a battery discharging capacity (or discharging time) measured in a predetermined discharging time (or discharging capacity) interval. The processor may compare the battery discharging capacity (or discharging time) measured in the configuration SOC interval with the spec stored in the memory and identify whether the battery discharging capacity satisfies a predetermined condition in step 1723. When the battery discharging capacity satisfies the predetermined condition, the processor may provide information related to a battery malfunction state to the user in step 1725. For example, the processor may provide information related to the battery malfunction state to the user through a notification device (vibration or sound) and/or a display device. When the battery discharging capacity does not satisfy a predetermined condition, the processor may continuously perform the discharging operation according to execution of the function. When a plurality of configured SOC intervals is included in the SOC2 interval, the processor may repeatedly perform the operation in the corresponding configured SOC interval. When the current SOC is area D, the processor may recognize it in step 1713 and continuously perform the discharging operation according to execution of the function.

For example, it is assumed that an algorithm operation area is about 30%<SOC2<about 70%, the configuration SOC interval is about 5%, and a discharging time of about 5% of the SOC of a normal battery is 10 minutes. For the reference value (spec) stored in the memory, it is assumed that the discharging time of about 5% is configured as 8 minutes to 12 minutes.

The electronic device may perform a predetermined function while consuming fixed power (for example, entire discharging current 500 mA). The processor may perform the discharging operation until the battery capacity reaches about 70% (maximum SOC in the SOC2 interval) in step 1715. When the configuration SOC is about 60% to about 55%, the processor may measure a discharging time when the battery capacity is discharged from about 60% to about 55% in step 1721. When the discharging time is measured as 7 minutes, the processor may recognize that 7 minutes of the measured discharging time satisfies a predetermined condition beyond the reference value in step 1723 and display a battery malfunction state in step 1725. At this time, displayed information may be information suggesting visit to a service center.

An electronic device according to various embodiments may include elements having a battery charging and discharging operation structure, recognize an SOC (capacity %) of a battery, has a charging scheme in which a Constance Current (CC) interval exists during charging, has a control capability for discharging the battery to a predetermined current, recognize a time according to a specific SOC when the battery is charged or discharged, has a storage space (memory) for storing specific content, and has a processing capability for comparing the stored content.

The electronic device according to various embodiments may measure a charging time in a specific CC interval when the battery is charged and a discharging time in a specific interval when the battery is discharged to a specific predetermined current, determine specific ranges of the charging time and the discharging time, and store the specific ranges in a specific storage space. The electronic device may measure a charging time in a specific CC interval when the battery is charged, compare the measured time with a stored charging specific range, and when the measured time is out of a configured reference range, stop charging and display a battery malfunction state on the display. The electronic device may measure a charging time in a specific CC interval when the battery is charged, compare the measured time with a stored charging specific range, and when the measured time is not out of the range, continue to charge the battery since the battery is in a normal state. The electronic device may measure a discharging time in a specific interval when the battery is discharged to a specific predetermined current, compare the measured time with a stored discharging specific range, when the measured time is out of a range, display a battery malfunction state on the display. The electronic device may measure a discharging time in a specific interval when the battery is discharged to a specific predetermined current, compare the measured time with a discharging specific range, and when the measured time is not out of a range, does not perform additional processing since the battery is in a normal state.

A method of controlling an operation of a battery by an electronic device according to various embodiments may include an operation of acquiring power for charging the battery from outside of the electronic device, an operation of charging the battery with a predetermined current value using the power, an operation of identifying charging state information based on a charging time in a predetermined charging state measurement interval and a capacity of the battery according to the charging after the charging starts, and an operation of, when the charging state information satisfies a predetermined condition, performing a predetermined operation related to the battery.

The operation of measuring the charging state information may include an operation of measuring a first capacity of the battery for a first predetermined time in a predetermined charging state measurement interval, an operation of charging the battery for a second predetermined time rather than the first predetermined time, and an operation of measuring a second capacity of the battery for a third predetermined time after the second predetermined time. The operation of performing the predetermined operation may include an operation of calculating a difference between the first capacity and the second capacity of the battery and an operation of, when the difference between the first capacity and the second capacity satisfies a predetermined condition, displaying a charging malfunction state of the battery.

The operation of identifying the charging state information may include an operation of measuring a first charging time for which the battery is charged with a first predetermined battery capacity in a predetermined charging state measurement interval and an operation of measuring a second charging time for which the battery is charged with a second predetermined battery capacity. The operation of performing the predetermined operation may include an operation of calculating a difference between the first charging time and the second charging time and an operation of, when the difference between the first charging time and the second charging time satisfies a predetermined condition, displaying a charging malfunction state of the battery.

The method of operating the battery by the electronic device may further include an operation of controlling discharging of the battery. The operation of controlling discharging of the battery may include an operation of performing a predetermined function using the battery, an operation of measuring discharging state information based on a discharging time in the predetermined discharging state measurement interval and a battery capacity according to discharging while the predetermined function is performed, and an operation of, when the discharging state information satisfies a predetermined condition, performing a predetermined operation related to the battery.

The operation of identifying the discharging state information may include an operation of measuring a first capacity of the battery for a first predetermined time in the discharging state measurement interval, an operation of discharging the battery on the basis of execution of the predetermined function for the second predetermined time rather than the first predetermined time, and an operation of measuring a second capacity of the battery for a third predetermined time after the second predetermined time. The operation of performing the predetermined operation may include an operation of calculating a difference between the first capacity and the second capacity of the battery and an operation of, when the difference between the first capacity and the second capacity satisfies the predetermined condition, displaying a malfunction state of the battery.

The operation of identifying the discharging state information may include an operation of measuring a first discharging time for which the battery is discharged to a first predetermined battery capacity in a predetermined discharging state measurement interval and an operation of measuring a second discharging time for which the battery is discharged to a second predetermined battery capacity. The operation of performing the predetermined operation may include an operation of calculating a difference between the first discharging time and the second discharging time of the battery and an operation of, when the difference between the first discharging time and the second discharging time satisfies a predetermined time, displaying a malfunction state of the battery.

The invention claimed is:

1. An electronic device comprising:
   a battery;
   a power management module; and
   a processor,
   wherein the processor is configured to acquire power for charging the battery from
   outside of the electronic device through the power management module, charge the battery with a predetermined current value using the power so that a battery capacity has more than a reference capacity included in a predetermined charging state measurement interval, identify charging state information based on a charging time in the predetermined charging state measurement interval in which the battery capacity is greater than or equal to the reference capacity after the charging starts and the battery capacity according to the charging, and perform a predetermined operation related to the battery when the charging state information satisfies a predetermined condition, and
   wherein the battery capacity changes linearly in proportion to the charging time of the battery in the predetermined charging state measurement interval.

2. The electronic device of claim 1, wherein the processor is configured to identify a first capacity of the battery for a first predetermined time in a predetermined discharging state measurement interval and a second capacity of the battery for a third predetermined time after a second predetermined time from the first predetermined time, and perform the predetermined operation related to the battery when a difference between the first capacity and the second capacity of the battery satisfies the predetermined condition.

3. The electronic device of claim 1, wherein the processor is configured to identify a first charging time for charging the battery with a first capacity and a second charging time for charging the battery with a second capacity in the predetermined charging state measurement interval, and perform the predetermined operation related to the battery when a difference between the first charging time and the second charging time satisfies the predetermined condition.

4. The electronic device of claim 1, wherein the processor is configured to perform an operation of stopping a charging operation and displaying a charging malfunction state when the predetermined condition is satisfied.

5. The electronic device of claim 1, wherein the processor is configured to perform an operation of identifying the charging state information when a charging measurement function is activated in the predetermined charging state measurement interval.

6. The electronic device of claim 1, wherein the processor is configured to perform a predetermined function using the battery, identify discharging state information, based on a discharging time in a predetermined discharging state measurement interval and the battery capacity according to discharging while the predetermined function is performed, and perform the predetermined operation related to the battery when the discharging state information satisfies the predetermined condition.

7. The electronic device of claim 6, wherein the processor is configured to identify a first capacity of the battery for a first predetermined time and a second capacity of the battery for a third predetermined time after a second predetermined time from the first predetermined time in the predetermined discharging state measurement interval, and perform the predetermined operation related to the battery when a difference between the first capacity and the second capacity of the battery satisfies the predetermined condition.

8. The electronic device of claim 6, wherein the processor is configured to identify a first discharging time for discharging the battery to a first battery capacity and a second discharging time for discharging the battery to a second battery capacity in the predetermined discharging state measurement interval, and perform the predetermined operation related to the battery when a difference between the first discharging time and the second discharging time satisfies the predetermined condition.

9. The electronic device of claim 6, wherein the processor is configured to perform an operation of identifying the discharging state information when a discharging measurement application is activated in the predetermined discharging state measurement interval.

10. A method of controlling an operation of a battery by an electronic device, the method comprising:
acquiring power for charging the battery from outside of the electronic device;
charging the battery with a predetermined current value using the power so that a battery capacity has more than a first reference capacity included in a predetermined charging state measurement interval;
identifying charging state information based on a charging time in the predetermined charging state measurement interval in which the battery capacity is greater than or equal to the first reference capacity after the charging starts and the battery capacity according to the charging; and
when the charging state information satisfies a predetermined condition, performing a predetermined operation related to the battery, and
wherein the battery capacity changes linearly in proportion to the charging time of the battery in the predetermined charging state measurement interval.

11. The method of claim 10, wherein the identifying of the charging state information comprises:
identifying a first battery capacity for a first predetermined time in the predetermined charging state measurement interval;
charging the battery in a second predetermined time rather than the first predetermined time; and
identify a second battery capacity for a third predetermined time after the second predetermined time,
wherein the performing of the predetermined operation comprises:
calculating a difference between the first battery capacity and the second battery capacity; and
when the difference between the first battery capacity and the second battery capacity satisfies the predetermined condition, displaying a charging malfunction state of the battery.

12. The method of claim 10, wherein the identifying of the charging state information comprises:
identifying a first charging time for which the battery is charged with a first battery capacity in the predetermined charging state measurement interval;
charging the battery with a second battery capacity; and
identifying a second charging time for which the battery is charged with the second battery capacity,
wherein the performing of the predetermined operation comprises:
calculating a difference between the first charging time and the second charging time; and
when the difference between the first charging time and the second charging time satisfies the predetermined condition, displaying a charging malfunction state of the battery.

13. The method of claim 10, further comprising controlling discharging of the battery,
wherein the controlling of the discharging of the battery comprises:
performing a predetermined function generating a fixed discharging current using the battery so that the battery capacity has more than a second reference capacity included in a predetermined discharging state measurement interval;
identifying discharging state information based on a discharging time in the predetermined discharging state measurement interval in which the battery capacity is less than or equal to the second reference capacity and a battery capacity according to the discharging while the predetermined function is performed; and
when the discharging state information satisfies the predetermined condition, performing the predetermined operation related to the battery.

14. The method of claim 13, wherein the identifying of the discharging state information comprises:
identifying a first battery capacity for a first predetermined time in the predetermined discharging state measurement interval;
discharging the battery, based on execution of the predetermined function for a second predetermined time rather than the first predetermined time; and
identifying a second battery capacity for a third predetermined time after the second predetermined time,
wherein the performing of the predetermined operation comprises:
calculating a difference between the first battery capacity and the second battery capacity; and
displaying a malfunction state of the battery when the difference between the first battery capacity and the second battery capacity satisfies the predetermined condition.

15. The method of claim 13, wherein the identifying of the discharging state information comprises:
identifying a first discharging time for discharging the battery to a first battery capacity in the predetermined discharging state measurement interval; and
identifying a second discharging time for discharging the battery to a second battery capacity,
wherein the performing of the predetermined operation comprises:

calculating a difference between the first discharging time and the second discharging time of the battery; and when the difference between the first discharging time and the second discharging time satisfies the predetermined condition, displaying a malfunction state of the battery.

\* \* \* \* \*